(12) United States Patent
Park

(10) Patent No.: US 12,112,826 B2
(45) Date of Patent: Oct. 8, 2024

(54) APPARATUS AND METHOD FOR READING DATA BASED ON A PROGRAM STATUS OF A NON-VOLATILE MEMORY DEVICE

(71) Applicant: SK hynix Inc., Gyeonggi-do (KR)

(72) Inventor: Kang Woo Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 183 days.

(21) Appl. No.: 17/965,369

(22) Filed: Oct. 13, 2022

(65) Prior Publication Data
US 2023/0402071 A1 Dec. 14, 2023

(30) Foreign Application Priority Data
Jun. 13, 2022 (KR) .......................... 10-2022-0071297

(51) Int. Cl.
G11C 7/10 (2006.01)
G11C 7/06 (2006.01)
G11C 7/12 (2006.01)

(52) U.S. Cl.
CPC ............ *G11C 7/1039* (2013.01); *G11C 7/067* (2013.01); *G11C 7/1069* (2013.01); *G11C 7/12* (2013.01)

(58) Field of Classification Search
None
See application file for complete search history.

(56) References Cited

U.S. PATENT DOCUMENTS

| 8,479,083 | B2 | 7/2013 | Chae et al. |
| 9,946,468 | B2 | 4/2018 | Conley et al. |
| 11,676,674 | B2* | 6/2023 | Hwang ............... G11C 16/3459 365/185.11 |
| 2012/0134207 | A1* | 5/2012 | Yoon .................... G11C 11/5642 365/185.09 |
| 2020/0257473 | A1 | 8/2020 | Kim et al. |

* cited by examiner

*Primary Examiner* — Tan T. Nguyen
(74) *Attorney, Agent, or Firm* — IP & T GROUP LLP

(57) ABSTRACT

A memory device includes a memory group comprising plural memory cells, a control circuitry configured to read a first hard decision data entry and a first soft decision data entry together from a first memory cell among the plural memory cells, and a page buffer circuit, coupled to the first memory cell via a bit line. The page buffer circuit includes plural data latches configured to store the first hard decision data entry and the first soft decision data entry and at least one cache latch configured to store one of the first hard decision data entry and the first soft decision data entry which are transferred from the plural data latches.

20 Claims, 21 Drawing Sheets

APPARATUS AND METHOD FOR READING DATA BASED ON A PROGRAM STATUS OF A NON-VOLATILE MEMORY DEVICE

CROSS-REFERENCE TO RELATED APPLICATIONS

This patent application claims the benefit of Korean Patent Application No, 10-2022-0071297, filed on Jun. 13, 2022, the entire disclosure of which is incorporated herein by reference.

TECHNICAL FIELD

Various embodiments described herein relate to a memory system and a method of controlling operation of a memory system.

BACKGROUND

A data processing system may include a memory system or a data storage device. The data processing system can be developed to store a large quantity of data in the data storage device, and may store data in the data storage device at a fast rate. The data processing system may also read data stored in the data storage device at a fast rate. The memory system or the data storage device can include non-volatile memory cells and/or volatile memory cells for storing data.

BRIEF DESCRIPTION OF THE DRAWINGS

The description herein makes reference to the accompanying drawings wherein like reference numerals refer to like parts throughout the figures.

DETAILED DESCRIPTION

Figure 1:
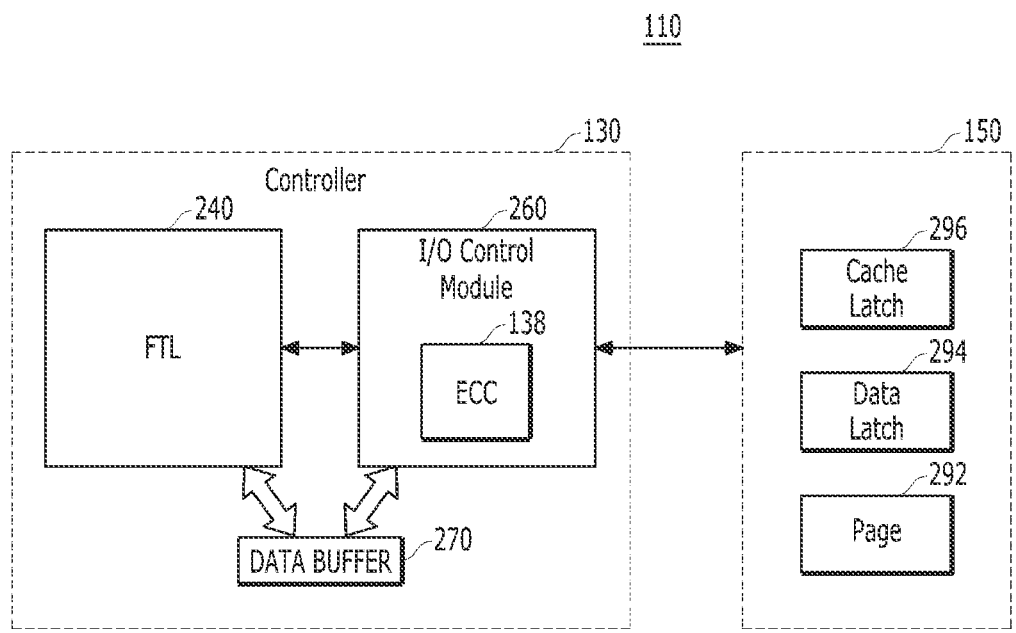
FIG. 1 illustrates an embodiment of a memory system.

Various embodiments of the present disclosure are described below with reference to the accompanying drawings. Elements and features of this disclosure may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. Furthermore, the terms in a claim do not foreclose the apparatus from including additional components, e.g., an interface unit, circuitry, etc.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational, e.g., is not turned on nor activated. The block/unit/circuit/component used with the "configured to" language include hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or is firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, a data entry, an entry of data, an item of data, or a data item may be a sequence of bits. For example, the data entry may include the contents of a file, a portion of the file, a page in memory, an object in an object-oriented program, a digital message, a digital scanned image, a part of a video or audio signal, metadata or any other entity which can be represented by a sequence of bits. According to an embodiment, the data entry may include a discrete object. According to another embodiment, the data entry may include a unit of information processed or handled for a data input/output operation. According to another embodiment, the data entry may include a unit of information within a transmission packet between two different components.

An embodiment in the present disclosure can provide a memory system, a data processing system, and an operation process or a method, which may quickly and reliably process data into a memory device by reducing operational complexity and performance degradation of the memory system, thereby enhancing usage efficiency of the memory device.

An embodiment of the present disclosure can provide an apparatus or a method for improving an input/output operation performance of the memory system.

In an embodiment, a memory system can include a memory group comprising a plurality of memory cells; a control circuitry configured to read a first hard decision data entry and a first soft decision data entry together from a first memory cell among the plurality of memory cells; and a page buffer circuit coupled to the first memory cell is via a bit line, the page buffer circuit comprising a plurality of data latches configured to store the first hard decision data entry and the first soft decision data entry and at least one cache latch configured to store one of the first hard decision data entry and the first soft decision data entry which are transferred from the plurality of data latches.

The plurality of data latches can include a first data latch configured to store the first hard decision data entry read from the first memory cell; and a second data latch configured to store the first soft decision data entry read from the first memory cell.

The at least one cache latch can be coupled to the first data latch via a first data path and coupled to the second data latch via a second data path.

The at least one cache latch can include a first cache latch coupled to the first data latch; and a second cache latch coupled to the second data latch.

The memory device can further include an input/output control circuit configured to receive a first read command and a first address indicating the first memory cell, and output the first hard decision data entry and the first soft decision data entry in response to the first read command; an input/output line coupling the input/output control circuit to the page buffer circuit; and an input/output data amplification circuit configured to amplify and transfer the first hard decision data entry and the first soft decision data entry via the input/output line.

The input/output data amplification circuit can include a plurality of sense amplifiers corresponding to the plurality of data latches.

The at least one cache latch and the input/output data amplification circuit can output one of three data statuses showing a combined value of the first hard decision data entry and the first soft decision data entry via a pair of input/output lines.

The memory device can further include a data compression circuit configured to compress the first soft decision data entry transferred from the input/output amplification circuit; a register configured to store a first compressed soft decision data entry output from the data compression circuit; and a multiplexer configured to output one of the first hard decision data entry and the first compressed soft decision data entry via the input/output line.

The input/output line can be configured to transfer one selected from the first hard decision data entry and the first compressed soft decision data entry.

The input/output control circuit can be configured to transfer the first soft decision data entry to an error correction circuitry after transfer the first hard decision data entry to the error correction circuitry via a channel.

The input/output control circuit can be configured to alternatively transfer the first hard decision data entry and the first soft decision data entry to an error correction circuitry coupled via a channel.

The control circuitry can be configured to consecutively read the first hard decision data entry and the first soft decision data entry from the first memory cell in response to the first read command. The input/output control circuit can be configured to output the first hard is decision data entry in response to the first read command, and output the first soft decision data entry after receiving a soft decision data read command associated with the first read command.

After the input/output control circuit receives a second read command and a second address, the control circuitry can be configured to consecutively read a second hard decision data entry and a second soft decision data entry from a second memory cell corresponding to the second address in response to the second read command. The input/output control circuit can be configured to output the first hard decision data entry the first soft decision data entry in response to the first read command, while the control circuitry consecutively reads the second hard decision data entry and the second soft decision data entry.

The first memory cell and the second memory cell can be coupled to the page buffer circuit via a same bit line.

In another embodiment, a memory system can include a controller configured to transfer a read command and an address associated with the read command to a memory device, receive data associated with the read command from the memory device, and perform an error correction based on hard decision data and soft decision data associated with the data after an error is detected in the data; and the memory device configured to consecutively read the hard decision data and the soft decision data from a first memory cell corresponding to the address in response to the read command. The memory device can include a memory group comprising a plurality of memory cells; a control circuitry configured to consecutively read the hard decision data and the soft decision data from the first memory cell among the plurality of memory cells; and a page buffer circuit, coupled to the first memory cell via a bit line, the page buffer circuit comprising a plurality of data latches configured to store the hard decision data and the soft decision data and at least one cache latch configured to store one of the hard decision data and the soft decision data which are transferred from the plurality of data latches.

The plurality of data latches can include a first data latch configured to store the hard decision data read from the first memory cell; and a second data latch configured to store the soft decision data read from the first memory cell.

The at least one cache latch can be coupled to the first data latch via a first data path and be coupled to the second data latch via a second data path.

The at least one cache latch can include a first cache latch coupled to the first data latch; and a second cache latch coupled to the second data latch.

The memory device can further include an input/output control circuit configured to receive the read command and the address indicating the first memory cell, and output the hard decision data and the soft decision data to the controller in response to the read command; an input/output line coupling the input/output control circuit to the page buffer circuit; and an input/output data amplification circuit configured to amplify and transfer the hard decision data and the soft decision data via the input/output line.

The input/output data amplification circuit can include a plurality of sense amplifiers corresponding to the plural data latches.

The at least one cache latch and the input/output data amplification circuit can output one of three data statuses showing a combined value of the hard decision data and the soft decision data via a pair of input/output lines.

The memory device can further include a data compression circuit configured to compress the soft decision data transferred from the input/output amplification circuit; a register configured to store a compressed soft decision data output from the data compression circuit; and a multiplexer configured to output one of the hard decision data and the compressed soft decision data via the input/output line.

In another embodiment, a method for operating a memory system can include consecutively reading a first hard decision data entry and a first soft decision data entry from a first memory cell in response to a first read command and a first address and storing the first hard decision data entry and the first soft decision data entry in a first data latch and a second data latch; transferring the first hard decision data entry and the first soft decision data entry from the first data latch and the second data latch to at least one cache latch; outputting the first hard decision data entry or the first soft decision data entry stored in the at least one cache latch via a channel coupled to a memory die; and consecutively reading a second hard decision data entry and a second soft decision data entry from a second memory cell, coupled to the first memory cell via a bit line, in response to a second read command and a second address while the first hard decision data entry and the first soft decision data entry are output from the first data latch and the second data latch via the channel.

Each of the first soft decision data entry and the second soft decision data entry can be output in response to a first soft decision data read command associated with the first read command and a second soft decision data read command associated with the second read command.

The first hard decision data entry and the second hard decision data entry can individually include inverted data delivered through a pair of input/output lines. The first soft decision data entry and the second soft decision data entry can be represented as one of three data statuses showing a combined value of hard decision data entry and soft decision data entry, which is delivered via the pair of input/output lines.

In another embodiment, a non-transitory computer-readable medium stores instructions which, when executed by one or more processors, cause the one or more processors to: consecutively read a first hard decision data entry and a first soft decision data entry from a first memory cell in response to a first read command and a first address, and store the first hard decision data entry and the first soft decision data entry in a first data latch and a second data latch; transfer the first hard decision data entry and the first soft decision data entry from the first data latch and the second data latch to at least one cache latch; output the first hard decision data entry or the first soft decision data entry stored in the at least one cache latch via a channel coupled to a memory die; and consecutively read a second hard decision data entry and a second soft decision data entry from a second memory cell, coupled to the first memory cell via a bit line, in response to a second read command and a second address while the first hard decision data entry and the first soft decision data entry are output from the first data latch and the second data latch via the channel.

An embodiment described herein can provide an apparatus and a method for improving a data input/output operation of a memory system or a data processing system.

Embodiments will now be described with reference to the accompanying drawings, wherein like numbers reference like elements.

FIG. 1 illustrates an embodiment of a memory system 110 which can store a data entry and output the stored data entry. The memory system 110 can include an area capable of storing a data entry, and a control device capable of performing an operation for storing, erasing, or reading a data entry. Examples of components included in the memory system 110 will be described later with reference to FIGS. 2 to 3.

Referring to FIG. 1, the memory system 110 can include a memory device 150 and a controller 130. The memory device 150 and the controller 130 included in the memory system 110 might be components that are physically separated from each other. The memory device 150 and the controller 130 can be connected to each other through at least one data path or at least one communication line. For example, the data path and the communication line could include a channel and/or a way.

According to an embodiment, the memory device 150 and the controller 130 may be components that are functionally separated from each other. Also, according to an embodiment, the memory device 150 and the controller 130 could be implemented through a single chip or a plurality of chips.

The controller 130 can include a Flash Translation Layer (FTL) 240 and an input/output control module 260. The flash translation layer (FTL) 240 included in the controller 130 can perform a data processing operation for transferring a data entry (e.g., host data) transferred from an external device (e.g., host 102, see FIG. 2) to the memory device 150 in order to store the data entry in the memory device 150. Because an address scheme (e.g., a logical address scheme) used by the external device and an address scheme (e.g., a physical address scheme) used within the memory system 110 are different from each other, the flash translation layer (FTL) 240 can determine a location in which the data entry is stored in the memory device 150. Also, the flash translation layer (FTL) 240 can generate map information or a map data entry used for associating a logical address and a physical address of the data entry with each other, Herein, the logical address regarding the data entry can be determined by the host 102, while the physical address regarding the data entry can be determined by the memory system 110.

The input/output control module 260 can control an operation for storing the data entry transferred from the flash conversion layer (FTL) 240 in the memory device 150. The memory device 150 can include a plurality of memory planes, each including a plurality of non-volatile memory cells. Data input/output operations can be performed in parallel within the memory device 150 to improve input/output operation performance. For example, when the input/output control module 260 can transmit a read command to the memory device 150, each of the plurality of memory planes in the memory device 150 can read a data entry stored in a plurality of memory cells and output the read data entry to the input/output control module 260 through channels.

According to an embodiment, the memory device 150 can include at least one memory die. The memory die can include at least one memory plane. The memory die can be understood as a component implemented on a physically distinguishable substrate. Each memory die can be connected to the controller 130 through a data path and may include an interface for exchanging a data entry and a signal with the controller 130.

As described above, the memory device 150 can include a plurality of memory planes. The memory plane can include at least one memory block, a driving circuit which is configured to control an array including a plurality of non-volatile memory cells, and at least one buffer configured to temporarily store data input to or output from the plurality of non-volatile memory cells. In one embodiment, the memory plane could be understood as a logical or physical partition including plural components.

Figure 2:
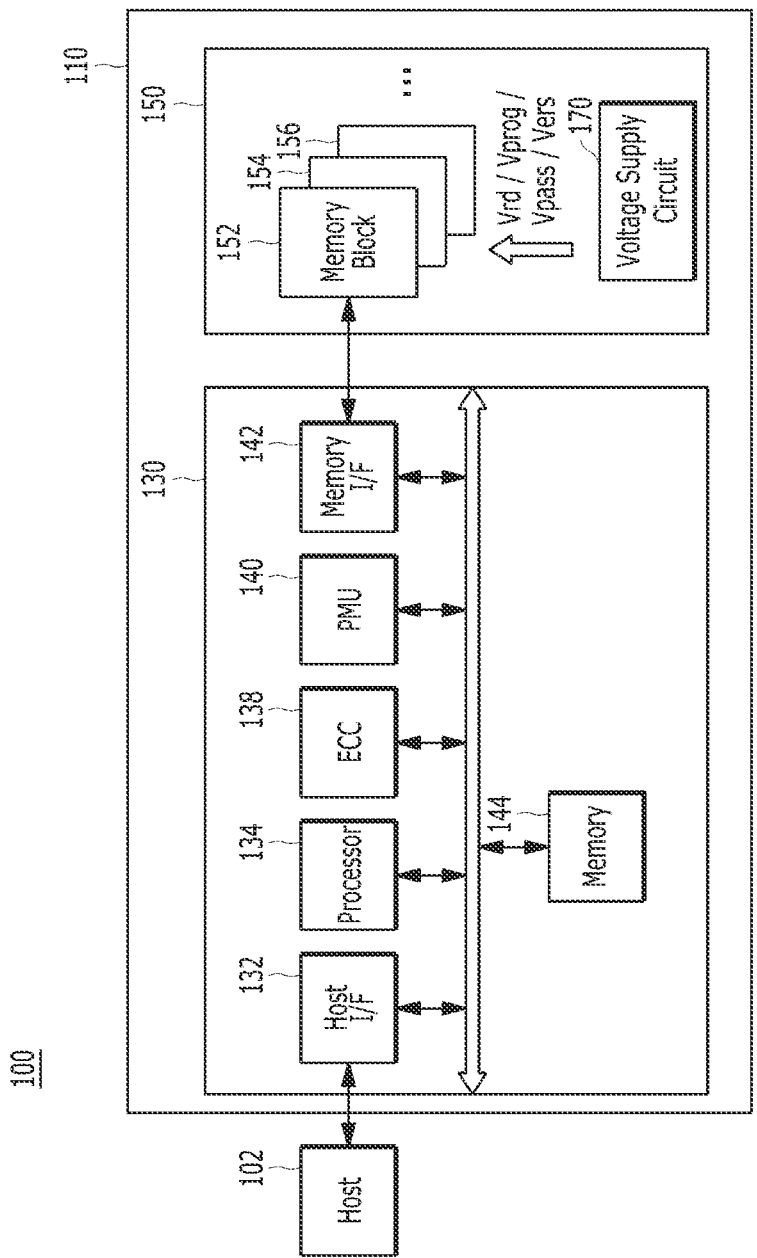
FIG. 2 illustrates an embodiment of a data processing system.

A memory die or a memory plane can include a plurality of memory blocks 152, 154, 156 (e.g., refer to FIG. 2). A memory block may include a group of non-volatile memory cells from which data is erased together through an erase operation. The memory blocks 152, 154, 156 can include a page 292, which is a group of non-volatile memory cells that store data together during a program operation or output data together during a read operation. For example, data output from the page 292 can be output to the controller 130 through a data latch 294 and a cache latch 296. Each of the memory blocks 152, 154, 156 can include a plurality of pages 292. The internal configuration of the memory device 150 described with reference to FIG. 1 can be changed, for example, in response to operating performance of the memory system 110, Embodiments of the present disclosure are not limited to the internal configuration described with reference to FIG. 1, Examples of the configuration and operation of the memory device 150 will be described later with reference to FIGS. 3 to 21.

According to an embodiment, the input/output control module 260 in the controller 130 can include a buffer corresponding to each memory the or each memory plane. The buffer can have a data structure such as a queue. The input/output control module 260 can determine a timing of including the data entry transmitted from the flash conversion layer (FTL) 240 in the data buffer 270. The data entry in the data buffer 270 can be sequentially transferred to the memory device 150.

According to an embodiment, the input/output control module 260 can be included in the memory interface 142 described with reference to FIG. 2. In another embodiment, the input/output control module 260 can be arranged between the flash translation layer (FTL) 240 and the memory interface 142.

Referring to FIG. 1, the input/output control module 260 can include error correction circuitry 138. Here, the error correction circuitry 138 can check and correct an error in a data entry transmitted through a channel or a way and received by the input/output control module 260, For example, the error correction circuitry 138 can correct an error included in read data output from the memory device 150 based on an error correction code (ECC). Even though the error correction circuitry 138 performs an error correction operation using the error correction code ECC, an error found in data output from the memory device 150 might not be corrected. If an error included in data corresponding to the read command would not be corrected, the controller 130 could consider that the read operation has failed.

According to an embodiment, the error correction circuitry 138 can include an encoder configured to encode a write data entry to be programmed in the memory device 150 using an error correction code (ECC). The memory system 110 can efficiently improve data reliability by using a technology that uses an error correction code (ECC) and signal processing technology. A data unit, to which an error correction code (ECC) used to detect or correct an error occurring in user data is applied, can be called a codeword. A n-bit codeword can include k-bit user data and a parity of (n-k) bits. A code rate is calculated as (kin). The higher the code rate, the more user data could be stored in a given codeword. The longer a length of the codeword and the smaller the code rate, the better error correction capability of the error correction code (ECC).

The error correction circuitry 138 can perform a decoding operation using data or information read from the memory device 150. The error correcting circuitry 138 can include a decoder that performs hard decision decoding or soft decision decoding according to how many bits of data or information are expressed. For example, a hard decision decoder can perform a decoding operation based on 1-bit information output from a memory cell. Herein, the 1-bit information can be called a hard decision data entry. On the other hand, a soft decision decoder can use more accurate information output from a memory cell, which is composed of two or more bits. This information can be called a soft decision data entry. Soft decision decoding can have a stronger error correction capability than hard decision decoding. However, the soft decision decoding might increase the complexity and power consumption in hardware implementation. Further, a process in which the memory device 150 acquires the soft decision data entry from a memory cell might increase read operation time compared to a process of acquiring the hard decision data entry.

For example, an operation for reading data within the memory device 150 can be controlled through a word line. A data entry stored in a plurality of memory cells coupled to a single word line can be simultaneously read. In a read operation, when a reference voltage applied to the word line one-time, different current can flow through a bit line according to a threshold voltage in each memory cell so that a sensing circuit can determine which data is stored in the corresponding memory cell. For example, to acquire the hard decision data entry, the memory device 150 can perform one-time sensing or read operation for the corresponding memory cell coupled to a word line. However, to acquire the soft decision data entry including 2-bit information indicating one of four data statuses/levels, the memory device 150 can perform three-time read or sensing operation in which a reference voltage is changed. The hard decision data entry and the soft decision data entry will be described with reference to FIG. 5.

When the error correction circuitry 138 in the memory system 110 detects an error in the data, the error correction operation can be performed step-by-step, e.g., in stages. For example, when an error is found in a data entry read from a single page, the error correction circuitry 138 can perform hard decision decoding on the corresponding data entry first. If an error in the corresponding data entry would not be recovered or cured through a hard decision decoding, the error correction circuitry 138 can perform read bias optimization for adjusting the read voltage Vrd and soft decision decoding alternately. However, because read bias optimization and soft decision decoding to recover errored data output from a single page might be performed using a relatively large number of sensing (read) operations, read latency could increase so that these operations could decrease or otherwise deteriorate quality of service (QoS).

The memory system 110 or the memory device 150 according to an embodiment of the present disclosure can acquire or obtain both a hard decision data entry and a soft decision data entry together or consecutively, while performing a read operation corresponding to a read command. At least some of read voltages applied through a word line to a memory cell by the memory device 150 to obtain the hard decision data entry and the soft decision data entry output from the corresponding memory cell might overlap. Accordingly, an operation margin for the memory device 150 to acquire both the hard decision data entry and the soft decision data entry through a same read operation can be smaller than an operation margin to separately obtain the hard decision data entry and the soft decision data entry thought different read operations. In response to a read command transmitted from the controller 130 to the memory device 150, the memory device 150 can obtain both the hard decision data entry and the soft decision data entry but output the hard decision data entry only to the controller 130. When the controller 130 transmits a soft decision data request or a soft decision data read command to the memory device 150, the memory device 150 can output the soft decision data entry read in advance to the controller 130, To perform this procedure, the data latch 294 coupled via a bit line to a single non-volatile memory cell in the memory device 150 can include a latch for storing the hard decision data entry and another latch for storing the soft decision data entry.

Increasing a space for temporarily storing data in the memory device 150 can reduce the degree of integration of the memory device 150. Although the memory device 150 according to an embodiment of the present disclosure can acquire both the hard decision data entry and the soft decision data entry, the memory device 150 can have a structure of reducing a space for temporarily storing the hard decision data entry and the soft decision data entry in the memory device 150 and reducing input/output lines and components for processing both the hard decision data entry and the soft decision data entry. In addition, processes of acquiring or outputting the hard decision data entry and the soft decision data entry in the memory device 150 can be integrated or performed in parallel, or so that the time spent on obtaining the soft decision data entry by the error correcting circuitry 138 in the controller 130 could be reduced. Through this embodiment, a data input/output speed of the memory system 110 could be improved.

Because the memory device 150 can include a plurality of data latches 294 coupled to a single bit line, it is possible to avoid a delay in obtaining the hard decision data entry or the soft decision data entry from the memory cell due to data transfer/movement between the data latches 294 and the cache latch 296 or data transfer/movement between the cache latch 296 and the controller 130, even when sequential read operations (e.g., sequential read, cache read) are performed within a same memory region.

Hereinafter, an apparatus and a method for reading a hard decision data entry and a soft decision data entry from a memory cell in the memory device 150 and transmitting the hard decision data entry and the soft decision data entry from the memory cell to the controller 130, according to an embodiment, will be described with reference to FIGS. 2 to 21.

FIG. 2 illustrate some operations that may be performed by the memory system 110 according to one or more embodiments of the present disclosure.

Referring to FIG. 2, the data processing system 100 may include a host 102 engaged or coupled with a memory system, such as memory system 110. For example, the host 102 and the memory system 110 can be coupled to each other via a data bus, a host cable and the like to perform data communications.

The memory system 110 may include a memory device 150 and a controller 130. The memory device 150 and the controller 130 in the memory system 110 may be physically separated from each other. The memory device 150 and the controller 130 may be connected via at least one data path. For example, the data path may include a channel and/or a way.

According to an embodiment, the memory device 150 and the controller 130 may be functionally divided. Further, according to an embodiment, the memory device 150 and the controller 130 may be implemented with a single chip or a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

As shown in FIG. 2, the memory device 150 may include a plurality of memory blocks 152, 154, 156. The memory blocks 152, 154, 156 may include a group of non-volatile memory cells in which data is removed together by a single erase operation. The memory block 152, 154, 156 may include a page which is a group of non-volatile memory cells that store data together during a single program operation, or output data together during a single read operation. For example, one memory block may include a plurality of pages.

For example, the memory device 150 may include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data input to, or output from, non-volatile memory cells.

In addition, according to an embodiment, the memory die may include at least one memory plane. The memory die may include a set of components implemented on a physically distinguishable substrate. Each memory die may be connected to the controller 130 through a data path. Each memory die may include an interface to exchange an item of data and a signal with the controller 130.

According to an embodiment, the memory device 150 may include at least one memory block 152, 154, 156, at least one memory plane, or at least one memory die. The internal configuration of the memory device 150 shown in FIGS. 1 and 2 may be different, for example, according to performance of the memory system 110. An embodiment of the present disclosure is not limited to the internal configuration shown in FIG. 2.

Referring to FIG. 2, the memory device 150 may include a voltage supply circuit 170 capable of supplying at least some voltage to the memory block 152, 154, 156. The voltage supply circuit 170 may supply a read voltage Vrd, a program voltage Vprog, a pass voltage Vpass, and/or an erase voltage Vers into a non-volatile memory cell included in the memory block. For example, during a read operation for reading data stored in the non-volatile memory cell included in the memory block 152, 154, 156, the voltage supply circuit 170 may supply the read voltage Vrd to a selected non-volatile memory cell. During the program operation for storing data in the non-volatile memory cell included in the memory block 152, 154, 156, the voltage supply circuit 170 may supply the program voltage Vprog to a selected non-volatile memory cell. Also, during a read operation or a program operation performed on the selected nonvolatile memory cell, the voltage supply circuit 170 may supply a pass voltage Vpass into a non-selected nonvolatile memory cell, During the erasing operation for erasing data stored in the non-volatile memory cell included in the memory block 152, 154, 156, the voltage supply circuit 170 may supply the erase voltage Vers to the memory block.

The memory device 150 may store information regarding various voltages which are supplied to the memory block 152, 154, 156 based on which operation is performed. For example, when a non-volatile memory cell in the memory block 152, 154, 156 can store multi-bit data, plural levels of the read voltage Vrd for recognizing or reading the multi-bit data entry may be used. The memory device 150 may include a table including information corresponding to plural levels of the read voltage Vrd, corresponding to the multi-bit data entry. For example, the table can include bias values stored in a register, each is bias value corresponding to a specific level of the read voltage Vrd. The number of bias values for the read voltage Vrd that is used for a read operation may be limited to a preset range. Also, the bias values can be quantized.

The host 102 may include a portable electronic device (e.g., a mobile phone, an MP3 player, a laptop computer, etc.) or a non-portable electronic device, e.g., a desktop computer, a game player, a television, a projector, etc.

The host 102 may also include at least one operating system (OS), which can control functions and operations performed in the host 102, The OS can provide interoperability between the host 102 (engaged operatively with the memory system 110) and a user who intends to store data in the memory system 110. The OS may support functions and operations corresponding to user requests, By way of example but not limitation, the OS can be classified into a general operating system and a mobile operating system according to the mobility of the host 102. The general operating system may be split into a personal operating system and an enterprise operating system according to system requirements or a user environment. As compared with the personal operating system, enterprise operating systems can be specialized for securing and supporting high performance computing.

The mobile operating system may be subject to support services or functions for mobility, e.g., a power saving function. The host 102 may include a plurality of operating systems. The host 102 may execute multiple operating systems interlocked with the memory system 110, corresponding to a user request. The host 102 may transmit a plurality of commands corresponding to the user requests into the memory system 110, thereby performing operations corresponding to the plurality of commands within the memory system 110.

A controller 130 in the memory system 110 may control a memory device 150 in response to a request or a command input from the host 102. For example, the controller 130 may perform a read operation to provide data read from the memory device 150 to the host 102 and may perform a write operation (or a program operation) to store data input from the host 102 in the memory device 150, In order to perform data input/output (I/O) operations, the controller 130 may control and manage internal operations of reading data, programming data, erasing data, or the like.

According to an embodiment, the controller 130 may include a host interface 132, a processor 134, the error correction circuitry (ECC) 138, a power management unit (PMU) 140, a memory interface 142, and a memory 144. Components included in the controller 130 as illustrated in FIG. 2 may vary according to structures, functions, operation performance, or the like, regarding the memory system 110.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like, Components may be added to or omitted from the controller 130 according to implementation of the memory system 110.

Each of the host 102 and the memory system 110 may include a controller or an interface for transmitting and receiving signals, data, and the like, in accordance with one or more predetermined protocols. For example, the host interface 132 in the memory system 110 may include an apparatus capable of transmitting signals, data, and the like, to the host 102 or receiving signals, data, and the like, from the host 102.

The host interface 132 included in the controller 130 may receive signals, commands (or requests), and/or data input from the host 102 via a bus. For example, the host 102 and the memory system 110 may use a predetermined set of rules or procedures for data communication or a preset interface to transmit and receive data therebetween, Examples of sets of rules or procedures for data communication standards or interfaces supported by the host 102 and the memory system 110 for sending and receiving data include Universal Serial Bus (USB), Mufti-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like, According to an embodiment, the host interface 132 is a type of layer for exchanging data with the host 102 and is implemented with, or driven by, firmware called a host interface layer (HIL). According to an embodiment, the host interface 132 can include a command queue.

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110, When a plurality of memory systems 110 are connected to a single host 102, the plurality of memory systems 110 may be divided into a master and a slave using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces which are used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface may be used because of its faster data transmission and reception rate and its less resource consumption in the host 102 used for the data transmission and reception.

The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device (e.g., like a device supported by a universal serial bus (USB)) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide a high transmission speed, as compared with other interfaces such as IDE and SATA. In the SCSI, the host 102 and at least one peripheral device (e.g., memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In the SAS, the host 102 and a plurality of peripheral devices are connected in series, and data transmission and reception between the host 102 and each peripheral device may be performed in a serial data communication scheme. The SAS can support connection between the host 102 and the peripheral device through a serial cable instead of a parallel cable, to easily manage equipment using the SAS and enhance or improve operational reliability and communication performance. The SAS may support connections of eight external devices to a single transceiver included in the host 102.

The Non-volatile memory express (NVMe) is a type of interface based at least on a Peripheral Component Interconnect Express (PCIe) and is designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., x1, x4, x8, or x16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second. The NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices, such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of data read from the memory device 150, and may include an error correction code (ECC) encoder and an ECC decoder. The ECC encoder may perform error correction encoding of data to be programmed in the memory device 150 to generate encoded data into which a parity bit is added, and store the encoded data in the memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 may determine whether the error correction decoding has succeeded or not, and may then output an instruction signal (e.g., a correction success signal or a correction fail signal) based on a result of the error correction decoding. The error correction circuitry 138 may use a parity bit, which has been generated during the ECC encoding process for the data stored in the memory device 150, in order to correct the error bits of the read data entries. When the number of the error bits is greater than or equal to the number of correctable error bits, the error correction circuitry 138 may not correct the error bits and instead may output a correction fail signal indicating failure in correcting the error bits.

According to an embodiment, the error correction circuitry 138 may perform an error correction operation based on a coded modulation. Examples include a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above-described codes.

For example, the ECC decoder may perform hard decision decoding or soft decision decoding on data transmitted from the memory device 150. The hard decision decoding may be performed using as one of two methods broadly classified for error correction. The hard decision decoding may include an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

The soft decision decoding may quantize a threshold voltage of a non-volatile memory cell in the memory device 150 by two or more quantized values, e.g., multiple bit data, approximate values, an analog value, and the like, in order to correct an error bit based on the two or more quantized values. The controller 130 can receive two or more alphabets or quantized values from a plurality of non-volatile memory cells in the memory device 150, and then perform decoding based on information generated by characterizing the quantized values as a combination of information such as conditional probability or likelihood.

According to an embodiment, the ECC decoder may use a low-density parity-check and generator matrix (LDPC-GM) code among methods designed for the soft decision decoding. The low-density parity-check (LDPC) code uses an algorithm that can read values of data from the memory device 150 in several bits according to reliability (not simply data of 1 or 0 like the hard decision decoding) and iteratively repeats it through a message exchange in order to improve reliability of the values. Then, the values are finally determined as data of 1 or 0. For example, a decoding algorithm using LDPC codes can be understood as probabilistic decoding. In the hard decision decoding, a value output from a non-volatile memory cell is decoded as 0 or 1, Compared to the hard decision decoding, the soft decision decoding can determine the value stored in the non-volatile memory cell based on the stochastic information. Regarding bit-flipping, which may be considered an error that can occur in the memory device 150, the soft decision decoding may provide improved probability of correcting the error and recovering data, as well as providing reliability and stability of corrected data. The LDPC-GM code may have a scheme in which internal LDGM codes can be concatenated in series with high-speed LDPC codes.

According to an embodiment, the ECC decoder may use, for example, low-density parity-check convolutional codes (LDPC-CCs) for the soft decision decoding. The LDPC-CCs may have a scheme using a linear time encoding and a pipeline decoding based on a variable block length and a shift register.

According to an embodiment, the ECC decoder may use, for example, a Log Likelihood Ratio Turbo Code (LLR-TC) for the soft decision decoding. A Log Likelihood Ratio (LLR) may be calculated as a non-linear function for a distance between a sampled value and an ideal value. In addition, a Turbo Code (TC) may include a simple code, for example, a Hamming code, in two or three dimensions and repeat decoding in a row direction and a column direction to improve reliability of values.

The power management unit (PMU) 140 may control electrical power provided to the controller 130. The PMU 140 may monitor the electrical power supplied to the memory system 110 (e.g., a voltage supplied to the controller 130) and provide the electrical power to components included in the controller 130. The PMU 140 may not only detect power-on or power-off, but also may generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. The memory interface 142 may generate a control signal for the memory device 150 and may process data input to, or output from, the memory device 150 under the control of the processor 134 in a case when the memory device 150 is a flash memory.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data for operations performed in the memory system 110 and the controller 130. For example, the memory 144 may temporarily store read data entries output from the memory device 150 in response to a read request from the host 102 before the read data entries are output to the host 102. In addition, the controller 130 may temporarily store write data entries input from the host 102 in the memory 144 before programming the write data entries in the memory device 150. When the controller 130 controls operations (such as a data read operation, a data write or program operation, a data erase operation, etc.) of the memory device 150, data transmitted between the controller 130 and the memory device 150 of the memory system 110 may be temporarily stored in the memory 144.

In addition to the read data entries or/rite data entries, the memory 144 may store information (e.g., map data, read requests, program requests, etc.) used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates, for example, the memory 144 disposed within the controller 130, embodiments are not limited thereto. The memory 144 may be located within or external to the controller 130, For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request entered from the host 102, According to an embodiment, the processor 134 may execute firmware to control the program operation or the read operation in the memory system 110, Herein, the firmware may be referred to as a flash translation layer (FTL). According to an embodiment, the processor 134 may be implemented with a microprocessor, a central processing unit (CPU), or the like.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved, According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. Background operations that can be performed without a command transmitted from the host 102 by the controller 130 include, for example, garbage collection (GC), wear leveling (WL), bad block management for identifying and processing bad blocks, or the like.

According an embodiment, substantially similar operations may be performed as both the foreground operation and the background operation. For example, when the memory system 110 performs garbage collection in response to a request or a command input from the host 102 (e.g., Manual GC), the garbage collection can be considered a foreground operation. When the memory system 110 performs garbage collection independently of the host 102 (e.g., Auto GC), the garbage collection can be considered a background operation.

When the memory device 150 includes a plurality of dies (or a plurality of chips), each including a plurality of non-volatile memory cells, the controller 130 may perform parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150. The plural groups of requests or commands are then processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes.

Such a processing method or scheme can be considered to be an interleaving method. Because a data input/output speed of the memory system 110 increases by operating with the interleaving method, data I/O performance of the memory system 110 can be improved.

By way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction (and/or a data) is delivered through by the controller can be associated with a physical block address. The controller 130 may refer to descriptors delivered from the memory device 150, The descriptors may include a block or page of parameters describing one or more features of the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

Referring to FIG. 2, the memory device 150 in the memory system 110 may include a plurality of memory blocks 152, 154, 156. Each of the memory blocks 152, 154, 156 includes a plurality of non-volatile memory cells. According to an embodiment, the memory block 152, 154, 156 can be a group of non-volatile memory cells that are erased together. The memory block 152, 154, 156 may include a plurality of pages, which is a group of non-volatile memory cells read or programmed together.

In one embodiment, each memory block 152, 154, or 156 may have a three-dimensional stack structure for high integration. Further, the memory device 150 may include a plurality of dies, each die including a plurality of planes, each plane including the plurality of memory blocks 152, 154, 156, the configuration of memory device 150 may be changed depending on performance of the memory system 110, FIG. 2 illustrates that the memory device 150 includes the plurality of memory blocks 152, 154, and 156. The plurality of memory blocks 152, 154, and 156 may be any of single-level cell (SLC) memory blocks, multi-level cell (MLC) memory blocks, or the like, according to the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, each memory cell storing multi-bit data, e.g., two or more bits of data. The MLC memory block may have larger storage capacity for the same space compared to the SLC memory block. The MLC memory block can be highly integrated in a view of storage capacity.

In an embodiment, the memory device 150 may be is implemented with MLC memory blocks such as a double level cell (DLC) memory block, a triple-level cell (TLC) memory block, a quadruple-level cell (QLC) memory block, and a combination thereof. The DLC memory block may include a plurality of pages implemented by memory cells, each memory cell capable of storing 2-bit data. The TLC memory block can include a plurality of pages implemented by memory cells, each memory cell capable of storing 3-bit data. The QLC memory block can include a plurality of pages implemented by memory cells, each memory cell capable of storing 4-bit data. In another embodiment, the memory device 150 can be implemented with a block including a plurality of pages implemented by memory cells, each memory cell capable of storing five or more bits of data.

According to an embodiment, the controller 130 may use an MLC memory block included in the memory device 150 as an SLC memory block that stores one-bit data in one memory cell. A data input/output speed of the mufti-level cell (MLC) memory block can be slower than that of the SLC memory block. For example, when the MLC memory block is used as the SLC memory block, the margin for a read or program operation can be reduced. For example, the controller 130 may perform a data input/output operation with a higher speed when the MLC memory block is used as the SLC memory block. Thus, the controller 130 may use the MLC memory block as a SLC buffer to temporarily store data because the buffer may have a high data input/output speed for improving performance of the memory system 110.

Further, according to an embodiment, the controller 130 can program data in an MLC a plurality of times without performing an erase operation on a specific MLC memory block included in the memory device 150, In general, non-volatile memory cells do not support data overwrite. However, the controller 130 may program 1-bit data in the MLC a plurality of times using a feature in which the MLC is capable of storing multi-bit data. For a MLC overwrite operation, the controller 130 may store the number of program times as separate operation information when 1-bit data is programmed in an MLC. According to an embodiment, an operation for uniformly levelling threshold voltages of the MLCs may be carried out before another 1-bit data is programmed in the same MLCs, each having stored 1-bit data.

In an embodiment, the memory device 150 is embodied as a non-volatile memory such as a flash memory, for example, a NAND flash memory, a NOR flash memory, or the like. In another embodiment, the memory device 150 may be implemented by at least one of a phase change random access memory (PCRAM), a ferroelectrics random access memory (FRAM), a transfer torque random access memory (STT-RAM), and a spin transfer torque magnetic random access memory (STT-MRAM), or the like.

Figure 3:
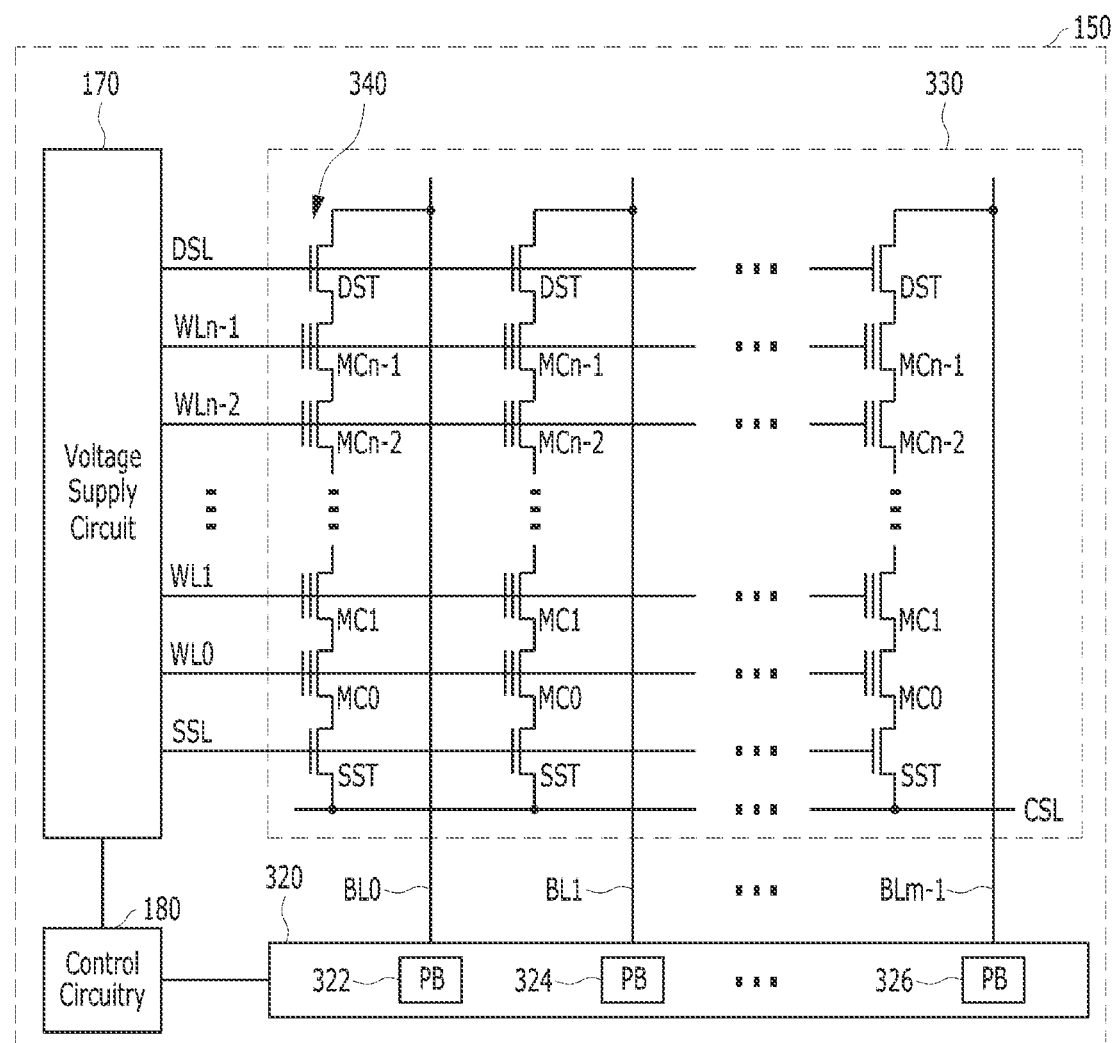
FIG. 3 illustrates an embodiment of a memory device.

FIG. 3 illustrates a memory device according to an embodiment of the present disclosure. Specifically, FIG. 3 schematically illustrates an embodiment of a memory cell array circuit in a memory die or memory plane included in the memory device 150.

Referring to FIG. 3, the memory device 150 may include at least one memory group 330 having a plurality of cell strings 340. Each cell string 340 may include a plurality of non-volatile memory cells MC0 to MCn-1 connected to a respective bit line of a plurality of bit lines BL0 to BLm-1. The cell strings 340 are disposed in respective columns of the memory group 330, and each cell string 340 can include at least one drain select transistor DST and at least one source select transistor SST. The non-volatile memory cells MC0 to MCn-1 of each cell string 340 may be connected in series between a drain select transistor DST and a source select transistor SST. Each of the non-volatile memory cells MC0 to MCn-1 may be configured as a multi-level cell (MLC) that stores a data entry having plural bits per cell. The cell strings 340 may be electrically connected to corresponding bit lines of the bit lines BL0 to BLm-1.

In the embodiment shown in FIG. 3, the memory group 330 may include NAND-type flash memory cells MC0 to MCn-1. In another embodiment, the memory group 330 can be implemented as a NOR-type flash memory, a hybrid flash memory in which at least two different types of memory cells are mixed or combined, or a one-chip NAND flash memory in which a controller is embedded in a single memory chip. In an embodiment, the memory group 330 can include a flash memory cell including a charge trap flash (CTF) layer that includes a conductive floating gate or insulating layer.

In an embodiment, the memory group 330 in memory device 150 may include one or more memory blocks 152, 154, 156. According to an embodiment, the memory device 150 can have a two-dimensional (2D) or three-dimensional (3D) structure. For example, each of the memory blocks 152, 154, 156 in the memory device 150 may be implemented as a 3D structure or a vertical structure. Each of the memory blocks 152, 154, 156 may have a three-dimensional structure extending along first to third directions, for example, an x-axis direction, a y-axis direction, and a z-axis direction.

The memory group 330 including the plurality of memory blocks 152, 154, 156 can be coupled to a plurality of bit lines BL, a plurality of string select lines SSL, and a plurality of drain select lines DSL, a plurality of word lines WL, a plurality of dummy word lines DWL, and a plurality of common source lines CSL. In an embodiment, the memory group 330 can include a plurality of NAND strings NS which, for example, may respectively correspond to cell strings 340. Each NAND string NS may include a plurality of memory cells MC and may be connected to a respective bit line of the bit lines BL. In addition, the string select transistor SST of each NAND string NS may be connected to a common source line CSL, and the drain select transistor DST of each NAND string NS can be connected to a corresponding bit line BL. In each NAND string NS, the memory cells MC may be arranged between the string select transistor SST and the drain select transistor DST.

FIG. 3 illustrates an embodiment of a memory device 150 which can include a voltage supply circuit 170 that supplies a word line voltage (e.g., one or more predetermined voltages such as a program voltage, a read voltage, and a pass voltage) for respective word lines according to an operation mode, or that supplies a voltage to a bulk (e.g., a well region) in which each memory block including the memory cells MC are formed. In this case, a voltage generating operation of the voltage supply circuit 170 may be performed under a control of a control circuitry 180. Also, the voltage supply circuit 170 may generate a plurality of variable read voltages to distinguish a plurality of data entries from each other. The plurality of variable read voltages can be applied to non-volatile memory cells in the memory group 330.

In response to control of the control circuit, one of the memory blocks (or sectors) of the memory cell array may be selected, and one of the word lines of the selected memory block may be selected. In one embodiment, word line voltages may be supplied to the selected word line and the unselected word line, individually. The voltage supply circuit 170 may include a voltage generation circuit (e.g., refer to FIGS. 6 to 8) for generating target voltages having various levels.

In an embodiment, the voltage supply circuit 170 may be coupled to a first pin or pad receiving a first power voltage VCC applied from the outside (e.g., an external device) and a second pin or pad receiving the second power voltage VPP applied from the external device. The second power voltage VPP may have a greater voltage level, e.g., twice or higher than that of the first power voltage VCC. For example, the first power voltage VCC may have a voltage level of 2.0V to 5.5V, while the second power supply voltage may have a voltage level of 9V to 13V.

According to an embodiment, the voltage supply circuit 170 can include a voltage generation circuit for more rapidly generating the target voltages of various levels used in the memory group 330. The voltage generation circuit can use the second power supply voltage VPP to generate a target voltage, which may have a higher voltage level than the second power voltage VPP.

The memory device 150 may also include a read/write circuit 320 controlled by the control circuitry 180. The read/write circuit 320 may operate as a sense amplifier or a write driver according to an operation mode. For example, in a verify operation and a read operation, the read/write circuit 320 may operate as a sense amplifier for reading the data entry from the memory cell array. In a program operation, the read/write circuit 320 may operate as a write driver that controls potentials of bit lines according to a data entry to be stored in the memory cell array. The read/write circuit 320 may receive the data entry to be programmed to the cell array from page buffers during the program operation. The read/write circuit 320 can drive bit lines based on the input data entry. To this end, the read/write circuit 320 may include a plurality of page buffers (PB) 322, 324, 326, with each page buffer corresponding to each column (or each bit line) or each column pair (or each bit line pair). According to an embodiment, a plurality of latches may be included in each of the page buffers 322, 324, 326.

The page buffers 322, 324, 326 may be coupled to a data input/output device (e.g., a serialization circuit or a serializer) through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without a waiting time. According to an embodiment, the input/output device can be included in an input/output control circuit 380 described with reference to FIG. 6. Further, the page buffers 322, 324, 326 described with reference to FIG. 5 can include a data register 254, for example, as described with reference to FIG. 6.

According to an embodiment, the memory device 150 may receive a write command, write data entries, and information (e.g., a physic& address) regarding a location in which the write data entries are to be stored. The control circuitry 180 causes the voltage supply circuit 170 to generate a program pulse, a pass voltage, etc., used for a program operation performed in response to a write command, and to generate one or more voltages used for a verification operation performed after the program operation.

When a multi-bit data entry is programmed in non-volatile memory cells included in the memory group 330, the error rate might be higher than that when a single-bit data entry is stored in the non-volatile memory cells. For example, an error in the non-volatile memory cells may be induced due to cell-to-cell interference (CCI). In order to reduce error in the non-volatile memory cells, a width (deviation) of a threshold voltage distribution, corresponding to stored data entries between the non-volatile memory cells, should be reduced.

To this end, the memory device 150 can perform an incremental step pulse programming (ISPP) operation to effectively make a narrow threshold voltage distribution of the non-volatile memory cells. In an embodiment, the memory device 150 can use the ISPP operation for multi-step program operations. For example, the memory device 150 may divide a program operation into a Least Significant Bit (LSB) program operation and a Most Significant Bit (MSB) operation according to a predetermined order between the non-volatile memory cells or pages.

Figure 4:
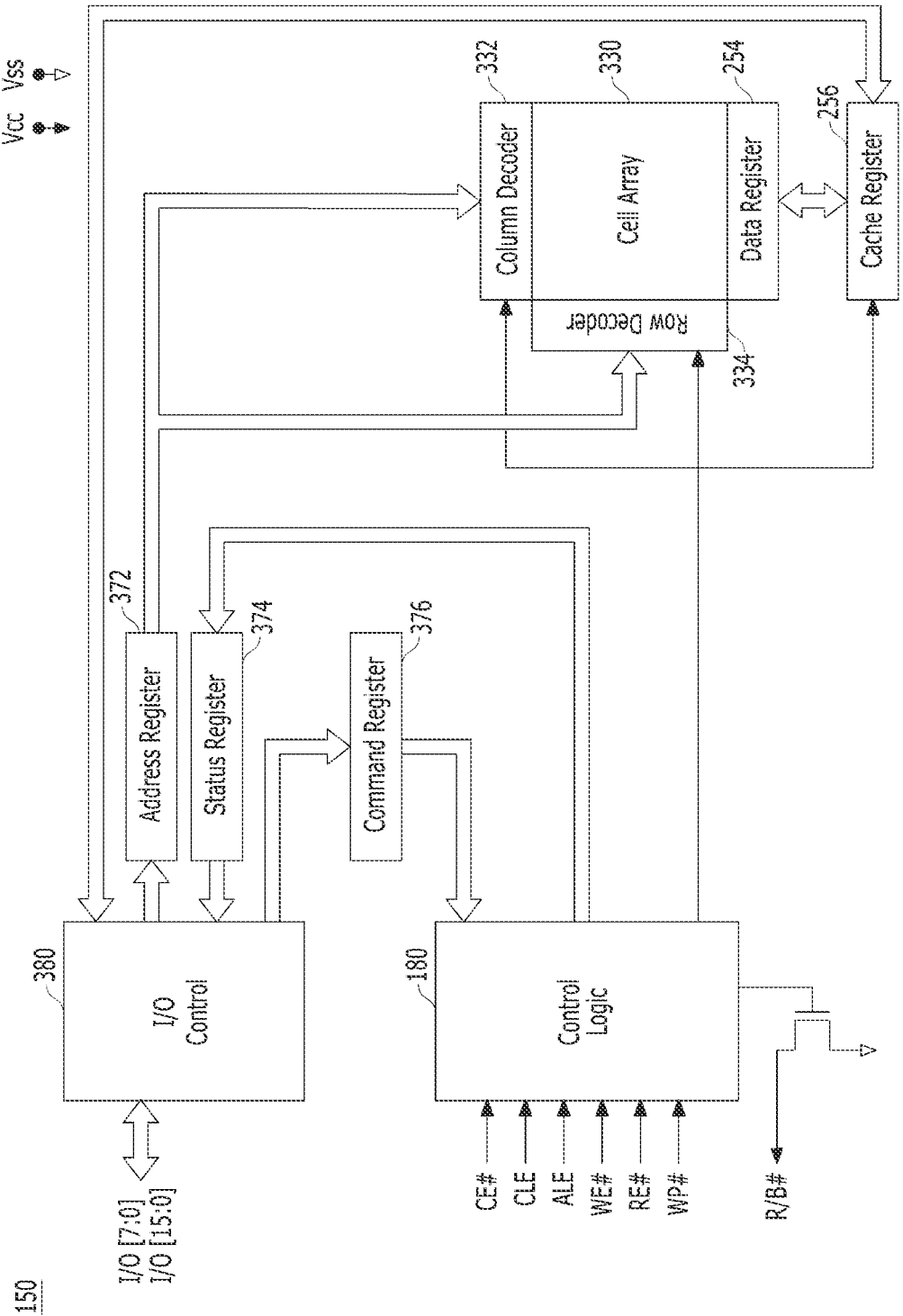
FIG. 4 illustrates an embodiment of a memory device.

FIG. 4 illustrates a memory device according to another embodiment of the present disclosure. Specifically, FIG. 4 describes a memory die included in the memory device 150.

Referring to FIG. 4, the memory device 150 can include at least one memory die. The memory device 150 can receive/output a plurality of control signals CE #, CLE, ALE, WE #, RE #, WP #, R/B #, and receive or transmit data or operation information through channels I/O[7:0], I/O[15:0]. For example, a predetermined quantity of data (e.g., 1 byte (8 bits) of data or 2 bytes (16 bits)) can be transmitted and received according to the width of the channel I/O[7:0], I/O[15:0] connecting the memory device 150 and the controller 130.

According to an embodiment, the memory device 150 can include a plurality of pins or pads. For example, the plurality of control signals CE #, CLE, ALE, WE #, RE #, WP #, R/B # can be transmitted or received through exclusively allocated pins. The control signals CE #, CLE, ALE, WE #, RE #, WP #, R/B # can include a chip enable signal CE #, a command latch enable signal CLE, an address latch enable signal ALE, a write enable signal WE #, a read enable signal RE #, a write protect signal WP #, a status signal R/B # indicating a ready state or a busy state, and the like. The control signals CE #, CLE, ALE, WE #, RE #, WP #, R/B # can be controlled (transmitted/received) by the control circuitry 180 in the memory device 150.

The memory device 150 can include the input/output control circuit 380. The input/output control circuit 380 can be connected to other devices or components (e.g., controller 130 of FIGS. 2 to 3 through the channels I/O[7:0], I/O[15:0]), The input/output control circuit 380 in the memory device 150 can be coupled to a plurality of registers 372, 374, 376 and a cache register 256 coupled to the cell array 330, The cell array 330 (as described in FIG. 6) can include the plurality of memory blocks 152, 154, 156, for example, as shown in FIG. 2, or a plurality of memory planes.

According to an embodiment, the memory device 150 may include the cache register 256, an address register 372, a status information register 374, and an instruction register 376. The cache register 256 can temporarily store data. When the memory device 150 performs a read operation, the cache register 256 can store a read data entry output from the cell array 330. When the memory device 150 performs a write operation or a program operation, the cache register 256 can store a write data entry. The address register 372 can store an address indicating a location where a read operation or a write operation is to be performed. The command register 376 can store a command to be executed by the memory device 150. The status information register 374 can store status information such as a result (failure/success) of an operation performed in the memory device 150 or readiness for performing an operation. For example, when a plurality of memory planes is included in a memory die in the memory device 150, the state information register 374 can store state information regarding each of the plurality of memory planes. Data, commands, information, and etc., transmitted or received through the input/output control circuit 380 in the memory device 150 can be controlled (e.g., transmitted, moved, or output) by the control logic circuitry 180.

For example, during a read operation in the memory device 150, a row decoder 334 and a column decoder 332 can select one or more memory cells in the cell array 330 based on an address stored in the address register 372 and a control signal from the control circuitry 180, A read data entry output from the cell array 330 may be stored in the data register 254 and then transferred from the data register 254 to the cache register 256 during a read operation. The read data entry stored in the cache register 256 is transferred to the input/output control circuit 380 through input/output lines. The read data entry transmitted to the input/output control circuit 380 can be output to the controller 130 through the channels I/O[7:0], I/O[15:0].

According to another example, during a write operation or a program operation in the memory device 150, the row decoder 334 and the column decoder 332 can select one or more memory cells in the array 330 in response to an address stored in the address register 372 and a control signal from the control circuitry 180. During the write operation, the write data entry transferred from the controller 130 to the input/output control circuit 380 through the channels I/O[7:0], I/O[15:0] can be stored in the cache register 256. Thereafter, the write data entry can be transferred from the cache register 256 to the data register 254. The write data entry stored in the data register 254 can be programmed in selected memory cells in the cell array 330 by the control circuitry 180.

The data register 254 and the cache register 256 described with reference to FIG. 4 can be included in the read/write circuit 320 described with reference to FIG. 3, According to an embodiment, the page buffers 322, 324, 326 described with reference to FIG. 3 can correspond to the data register 254 and/or the cache register 256 described with reference to FIG. 4.

Figure 5:
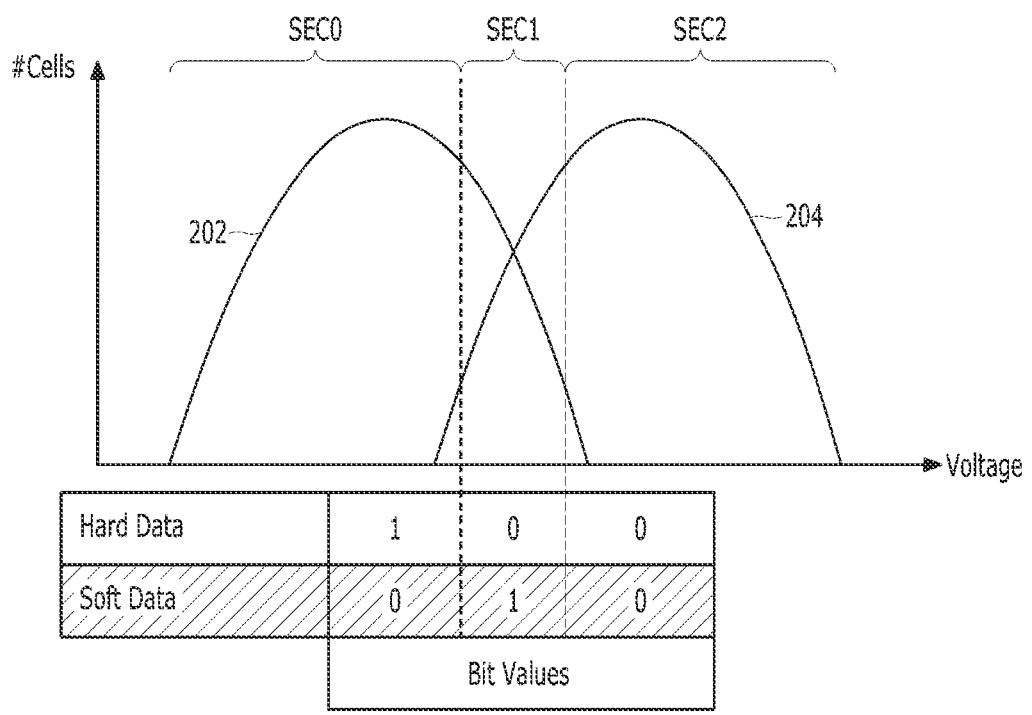
FIG. 5 illustrates an example of hard decision data and soft decision data which may be output from a memory device.

FIG. 5 illustrates hard decision data and soft decision data output from the memory device. FIG. 5 describes the hard decision data and the soft decision data in an example of adjacent threshold voltage distributions regarding data stored in non-volatile memory cells. When data is programmed in non-volatile memory cells, adjacent threshold voltage distributions corresponding to two different data do not overlap each other. When the memory device 150 reads data stored in the non-volatile memory cells, a possibility that the data contains an error could be reduced when the adjacent threshold voltage distributions are not overlapped or separated from each other. When data have been stored in memory cells for a long time (e.g., when a data retention time is long or greater than a predetermined time), or when the memory cells is not healthy (e.g., when the memory cells wear too much or are susceptible to another type of condition or defect), at least a portion of the threshold voltage distributions corresponding to data stored in the memory cells can be overlapped. In FIG. 5, for convenience of description, a case in which two threshold voltage distributions 202, 204 corresponding to data of '0' and '1' are partially overlapped (in section SEC1) will be described as an example.

Referring to FIG. 5, when at least a portion of the two threshold voltage distributions 202, 204 overlap, with respect to data of '0' and ° the memory device 150 can recognize three different threshold voltage distribution sections SEC0, SEC1, SEC2. For example, the first section SEC0 can correspond to data of a first value (e.g., '1'), and the third section SEC2 can correspond to data of a second value (e.g., '0'), When a threshold voltage of a memory cell in the memory device 150 belongs to the first section SEC0, the memory device 150 can determine that data of '1' is stored in the corresponding memory cell. It is very unlikely that the original data stored in the corresponding memory cell is '1', When a threshold voltage of a memory cell in the memory device 150 belongs to the third section SEC0, the memory device 150 can determine that data of '0' is stored in the corresponding memory cell. It is very unlikely that the original data stored in the corresponding memory cell is '0'. However, when a threshold voltage of a memory cell in the memory device 150 belongs to the second section SEC1, then a condition may arise where the memory device 150 might not clearly determine whether data stored in the corresponding memory cell is '1' or '0'. If the memory device 150 determines that the data stored in the corresponding memory cell is either '1' or '0', the error probability could be higher than a preset criterion. For example, the memory device 150 can set a preset criterion for determining data in a memory cell having a threshold voltage belonging to the second section SEC1, according to a case in which error probability is a certain percentage, e.g., 30%, 40%, 50%, 60%, or 70%.

When the threshold voltage of the memory cell belongs to the first section SEC0, the memory device 150 can determine a hard decision data entry (hard data) of the corresponding memory cell as '1', and a soft decision data entry (soft data) as '0'. When the threshold voltage of the memory cell belongs to the third section SEC2, the memory device 150 can determine a hard decision data entry (hard data) of the corresponding memory cell as '0', and a soft decision data entry (soft data) as '0'. When the probability that the data is an error is low (e.g., in the first section and the third section SEC0, SEC2), the soft decision data entry of the corresponding memory cell can be '0'.

For example, the memory device 150 can set the second section SEC1 corresponding to error probability of 50%.

When a threshold voltage of a memory cell belongs to the second section SEC1, data stored in the corresponding memory cell can be recognized as '0' in a first read operation performed by the memory device 150. But, during a second read operation performed by the memory device 150, the data stored in the corresponding memory cell can be recognized as "1", When the threshold voltage of the corresponding memory cell belongs to the second section SEC1, the memory device 150 can determine the hard decision data entry (hard data) of the corresponding memory cell as meaninglessness (e.g., Don't Care, X). However, in the embodiment described with reference to FIG. 5, the hard decision data entry can be determined as '0', Instead, the memory device 150 can determine the soft decision data entry (soft data) of the corresponding memory cell as T.

Referring to FIG. 5, a combined value of a hard decision data entry and a soft decision data entry output from a memory cell can be determined in one of three statuses, e.g., '00', '01', and '10'. A case in which the memory device 150 outputs the combined value as '11' might not occur. In the case where the combined value of the hard decision data entry and the soft decision data entry is one of three statuses, not four statuses corresponding to two-bit data, the combined value can be transmitted in the memory device 150 like one-bit data. A method for transferring the combined value in the memory device 150 will be described later with reference to FIGS. 20 to 21.

Figure 6:
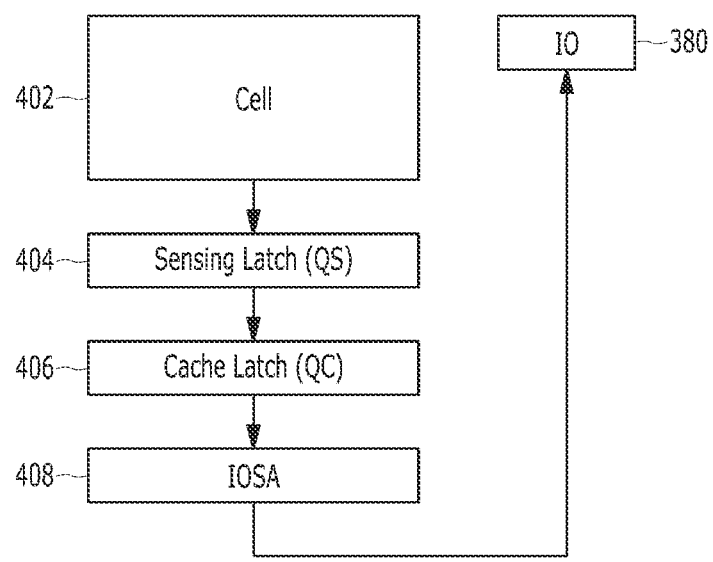
FIG. 6 illustrates an example of a memory device.

FIG. 6 illustrates an embodiment of a memory device which focuses on a path through which data stored in a memory cell is output during a read operation.

Referring to FIG. 6, the memory device 150 can include a memory cell 402, a sensing latch 404, a cache latch 406, an input/output sense amplifier 408, and an input/output control circuit 380, The memory cell 402 can be included in the cell array 330 described, for example, with reference to FIGS. 3 and 4. In one embodiment, the sensing latch 404 can correspond to the data latch 294 described in FIG. 1, the page buffer 322 described in FIG. 3, and the data register 254 described in FIG. 4. The cache latch 406 can correspond to the cache latch 296 described in FIG. 1 and the cache register 256 described in FIG. 4. The hard decision data entry or the soft decision data entry stored in the cache latch 406 can be sensed and amplified through the input/output sense amplifier 408 and then transmitted to the input/output control circuit 380.

Figure 7:
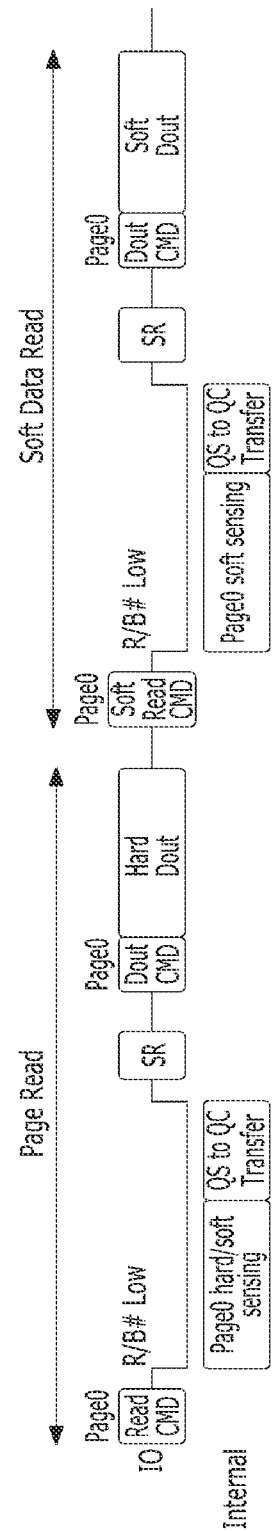
FIG. 7 illustrates an example of an operation for outputting hard decision data and soft decision data from the memory device shown in FIG. 6.

Referring to FIGS. 3 and 6, the memory device 150 can include the cell array 330 including the memory cell 403 and the page buffer circuit including the single sensing latch 404 and the single cache latch 406, FIG. 7 illustrates an operation for outputting a hard decision data entry and a soft decision data entry from the memory device shown in FIG. 6. A read operation can be divided into an operation (Internal) performed inside the memory device 150 and an operation (10) performed between the memory device 150 and the controller 130.

A read operation performed by the memory device 150 can be divided into a page read operation (Page Read) and a soft decision data read operation (Soft Data Read), In FIG. 7, a case in which the memory device 150 obtains the hard decision data entry and the soft decision data entry, separately and individually, during the read operation performed in response to a read command will be described as an example.

When a read command Read CMD regarding a first page Page0 is input to the memory device 150, the control circuitry 180 in the memory device 150 can change a status signal R/B # to a predetermined level, e.g., a logic low level. The control circuitry 180 can perform a sensing operation (Page0 hard sensing) for obtaining a hard decision data entry from the first page Page0. The obtained hard decision data entry can be transferred from the sensing latch 404 to the cache latch 406 (QS to QC Transfer).

The controller 130 can check state information of the memory device 150, and the memory device 150 can check whether the read operation on the first page Page0 is completed (SR), When the controller 130 transfers a data output command (Dout CMD) regarding the first page Page0 to the memory device 150, the memory device 150 can output the hard decision data entry to the controller 130 (Hard Dout).

When the hard decision data entry is output, the page read operation (Page Read) is terminated. The controller 130 can check and correct an error in a data entry transmitted from the memory device 150 based on the hard decision data entry. If an error is not detected in the data entry or the detected error is corrected, the operation corresponding to the read command (Read CMD) for the first page Page0, which is transmitted by the controller 130 to the memory device 150, can be terminated. If an error is detected in the data entry and the error is not corrected, the controller 130 can transmit a soft decision data read command (Soft Read CMD) regarding the first page Page0 to the memory device 150.

When the soft decision data read command (Soft Read CMD) is input, the control circuitry 180 in the memory device 150 can set the status signal R/B # to a predetermined level, e.g., a logic low level. The control circuitry 180 can perform a sensing operation (Page0 soft sensing) for obtaining a soft decision data entry from the first page Page0. The obtained soft decision data entry can be transferred from the sensing latch 404 to the cache latch 406 (QS to QC Transfer).

The controller 130 can check state information of the memory device 150, and the memory device 150 can check whether the read operation on the first page Page0 is completed (SR), When the data output command (Dout CMD) regarding the first page Page0 is input, the memory device 150 can output the soft decision data entry to the controller 130 (Soft Dout).

Referring to FIGS. 6 and 7, the memory device 150 can include the single sensing latch 404 and the single cache latch 406 coupled to the single memory cell 402. In this structure, the memory device 150 cannot acquire the hard decision data entry and the soft decision data entry together or consecutively from the memory cell 402. When the controller 130 includes an error in the data entry output from the first page Page0, it might take a relatively long time to receive the soft decision data entry.

Figure 8:
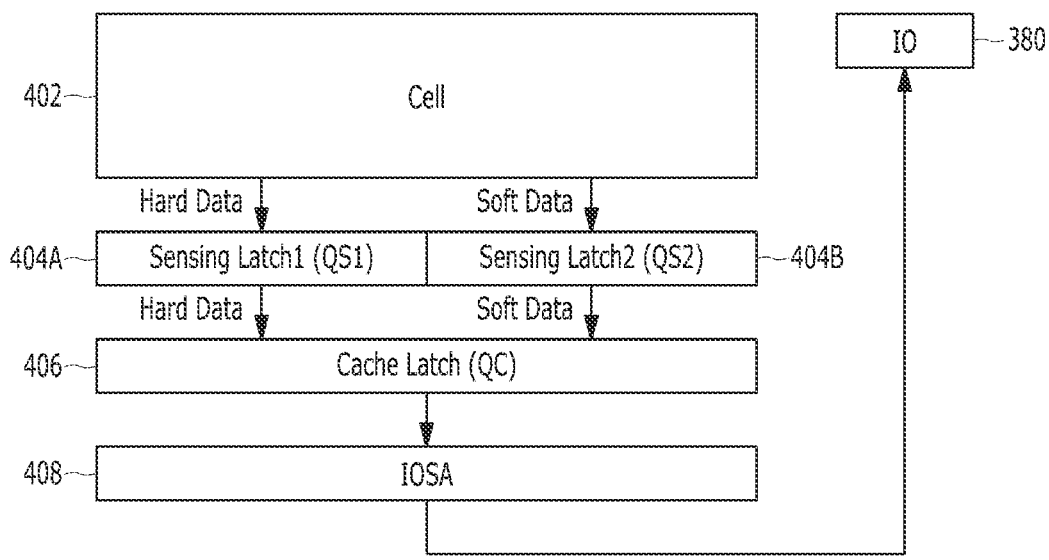
FIG. 8 illustrates an embodiment of a memory device.

FIG. 8 illustrates an embodiment of memory device 150 which can include a memory cell 402, a plurality of sensing latches 404A, 404B, a cache latch 406, an input/output sense amplifier 408, and an input/output control circuit 380. The memory cell 402 can be included in the cell array 330, for example, as described with reference to FIGS. 3 to 4. The plurality of sensing latches 404A, 404B can correspond to the data latch 294 described in FIG. 1, the page buffer 322 described in FIG. 3, and the data register 254 described in FIG. 4, The cache latch 406 can correspond to the cache latch 296 described in FIG. 1 and the cache register 256 described in FIG. 4.

The memory device 150 can obtain both a hard decision data entry and a soft decision data entry together or consecutively from the memory cell 402, The memory device 150 can include a plurality of sensing latches 404A, 404B coupled to the single memory cell 402. For example, the hard decision data entry is obtained from the memory cell 402 and then stored in the first sensing latch 404A. The soft decision data entry is obtained from the memory cell 402 and then stored in the second sensing latch 4048. The hard decision data entry and the soft decision data entry stored in the plurality of sensing latches 404A, 4048 can be sequentially transferred to the cache latch 406. The hard decision data entry or the soft decision data entry stored in the cache latch 406 can be sensed and amplified through the input/output sense amplifier 408 and transmitted to the input/output control circuit 380.

Figure 9:
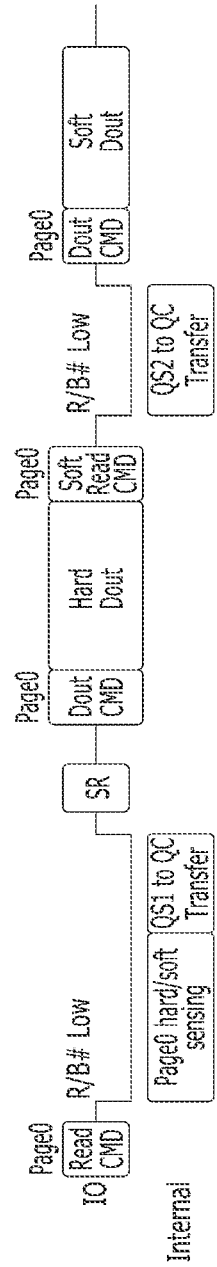
FIG. 9 illustrates an example of an operation for outputting hard decision data and soft decision data from the memory device shown in FIG. 8.

FIG. 9 illustrates an operation for outputting a hard decision data entry and a soft decision data entry from the memory device shown in FIG. 8. A read operation can include an operation (Internal) performed inside the memory device 150 and another operation (IO) performed between the memory device 150 and the controller 130.

Referring to FIGS. 8 and 9, a case in which the memory device 150 obtains the hard decision data entry and the soft decision data entry together or consecutively during a read operation performed in response to a read command will be described as an example.

When the read command Read CMD regarding the first page Page0 is input to the memory device 150, the control circuitry 180 in the memory device 150 can set the status signal R/B # to a predetermined level, e.g., a logic low level. The control circuitry 180 can perform a sensing operation (Page0 hard/soft sensing) for obtaining both the hard decision data entry and the soft decision data entry from the first page Page0. The obtained hard decision data entry can be transferred from the first sensing latch 404A to the cache latch 406 (QS1 to QC Transfer).

The controller 130 can check state information of the memory device 150, and the memory device 150 can check whether both the hard decision data entry and the soft decision data entry are secured through a read operation regarding the first page Page0 (SR). When a data output command (Dout CMD) regarding the first page Page0 is input, the memory device 150 can output the hard decision data entry stored in the cache latch 406 to the controller 130 (Hard Dout).

The controller 130 can check and correct an error in a data entry transmitted from the memory device 150 based on the hard decision data entry. If an error is not found in the data entry or the error is corrected, an operation corresponding to the read command (Read CMD) regarding the first page Page0 transmitted by the controller 130 to the memory device 150 may be terminated. If an error is found in the data entry and the error is not corrected, the controller 130 can transmit a soft decision data read command (Soft Read CMD) regarding the first page Page0 to the memory device 150. According to an embodiment, the controller 130 can secure the hard decision data entry from the first page Page0 and then transfer the soft decision data read command (Soft Read CMD) to the memory device 150 to secure the soft decision data entry regarding the first page Page0.

When the soft decision data read command (Soft Read CMD) is input, the control circuitry 180 in the memory device 150 can set the status signal R/B # to a predetermined level, e.g., a logic low level, Because the soft decision data entry regarding the first page Page0 has been obtained together or consecutively with the hard decision data entry and stored in the second sensing latch 4043, the control circuitry 180 does not have to perform a sensing operation (Page0 soft sensing) for obtaining the soft decision data entry from the page Page0. The previously obtained soft decision data entry can be transferred from the second sensing latch 404 to the cache latch 406 (QS2 to QC Transfer).

The controller 130 does not have to additionally check the state information of the memory device 150. When the data output command (Dout CMD) regarding the first page Page0 is input, the memory device 150 can output the soft decision data entry to the controller 130 (Soft Dout).

Referring to FIGS. 8 and 9, the memory device 150 can include a plurality of sensing latches 404A, 4043 coupled to the memory cell 402 and the single cache latch 406. The memory device 150 can obtain both the hard decision data entry and the soft decision data entry together or consecutively from the memory cell 402 and store the hard decision data entry and the soft decision data entry in different sensing latches 404A, 4043. When the controller 130 includes an error in the data entry output from the first page Page0, an operation margin where the controller 130 receives the soft decision data entry output from the memory device 150 could be reduced.

Figure 10:
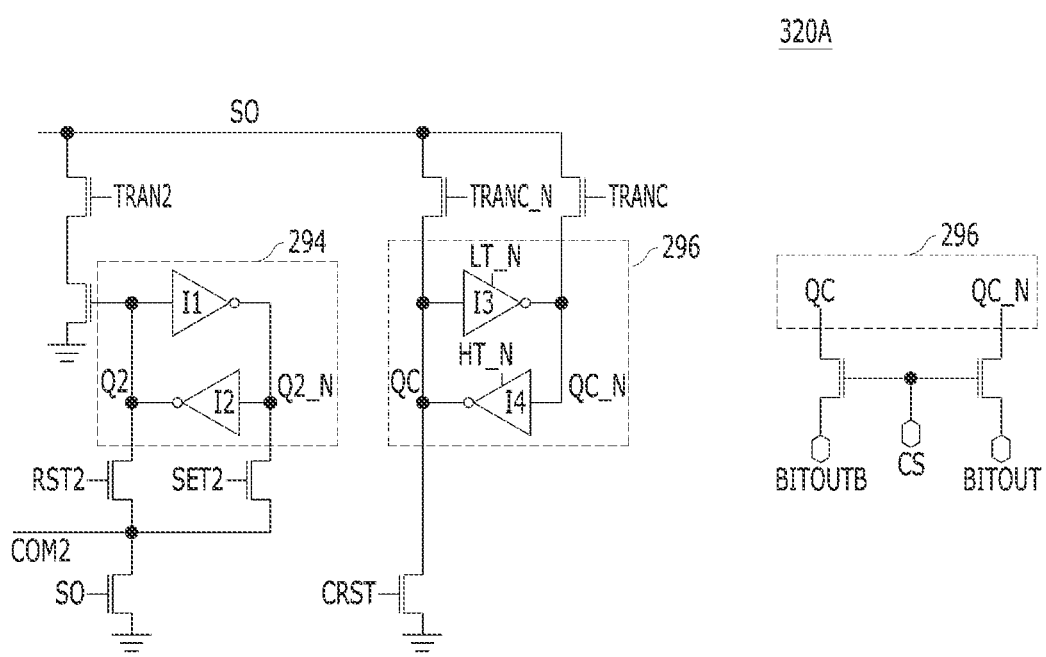
FIG. 10 illustrates an embodiment of a page buffer circuit included in a memory device according to an embodiment of the present disclosure.

FIG. 10 illustrates an embodiment of a page buffer circuit included in the memory device. More specifically, FIG. 10 shows an example of a partial configuration of the first page buffer circuit 320A which can correspond to the page buffer circuit 320 described with reference to FIG. 3.

Referring to FIG. 10, the data latch 294 and the cache latch 296 included in the first page buffer circuit 320A can be connected to a sense line SO which is coupled to the memory cell 402. The data latch 294 can have a plurality of inverters (11, 12) connected to the nodes Q2, Q2_N, After a read operation, a reset signal RST2 and a set signal SET2 can be used to reset or set the data latch 294 to store a specific value therein. The data latch 294 can be connected to a reference voltage (e.g., ground) through the sense line SO before the memory device senses a data entry stored in the memory cell 402. The cache latch 296 coupled to the data latch 294 can include a plurality of inverters (13, 14) connected to nodes QC, QC_N, The cache latch 296 can be reset by a reset signal QRST. The sense line SO can be coupled to the memory cell 402. A value or a data entry read and transferred from the memory cell 402 can be stored in the data latch 294 or the cache latch 296 by latch control signals TRAN2, TRANC_N, TRANC.

Because the memory cell 402, the data latch 294, and the cache latch 296 are all connected through the same sense line SO, the hard decision data entry or the soft decision data entry could not be simultaneously transferred from the memory cell 402 to the data latch 294 and from the data latch 294 to the cache latch 296. Further, a process of transferring the hard decision data entry or the soft decision data entry from the cache latch 296 through input/output lines BITOUTB, BITOUT in response to the cache transfer signal CS cannot be simultaneously performed with a process of transferring the hard decision data entry or the soft decision data entry either from the memory cell 402 to the data latch 294 or from the data latch 294 to the cache latch 296. Accordingly, even if the first page buffer circuit 320A includes a plurality of data latches 294 corresponding to the single memory cell 402, improving an input/output speed of the memory device 150 might be restricted.

Figure 11:
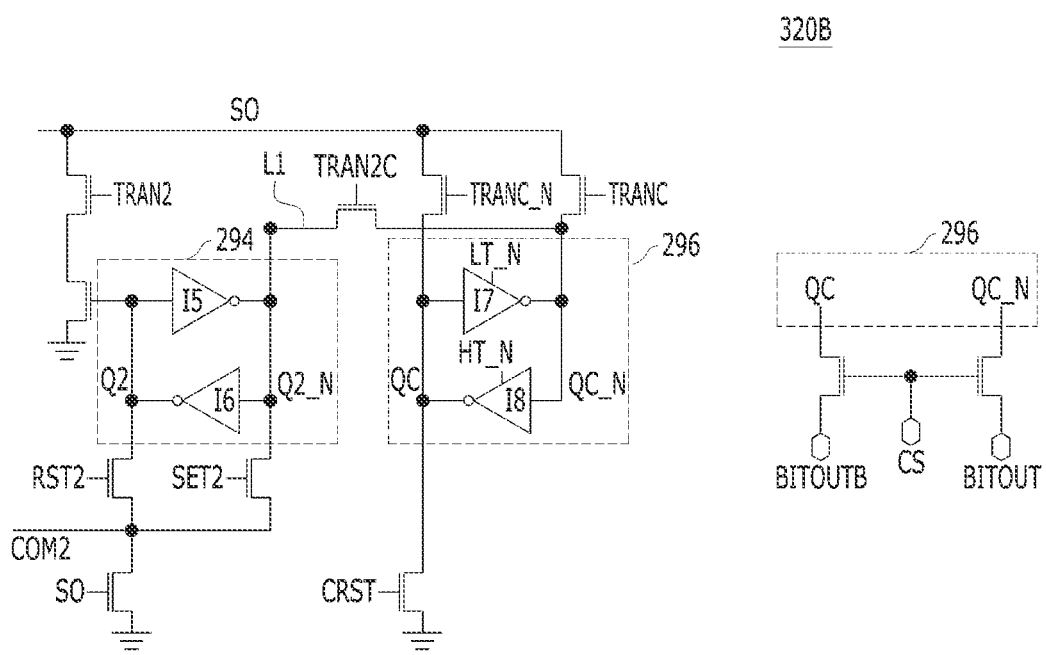
FIG. 11 illustrates an embodiment of a page buffer circuit included in a memory device.

FIG. 11 illustrates an embodiment of a page buffer circuit included in the memory device, More specifically, FIG. 11 shows an example of a partial configuration of the second page buffer circuit 320B which can correspond to the page buffer circuit 320 described with reference to FIG. 3.

Referring to FIG. 11, the data latch 294 and the cache latch 296 included in the second page buffer circuit 320B can be connected to the sense line SO which is coupled to the memory cell 402. The data latch 294 has a plurality of inverters (15, 16) connected to nodes Q2, Q2_N. A value stored in the data latch 294 after a read operation can be reset or set by the reset signal RST2 or the set signal SET2. For a program operation or a program mode (e.g., a program inhibit mode, a coarse program mode or a fine program mode), the memory device 150 can set a specific value in the data latch 294. The data latch 294 could be connected to a ground voltage by the sense line SO before a data entry stored in the memory cell 402 is read and sensed. The cache latch 296 coupled to the data latch 294 can include a plurality of inverters (17, 18) connected to nodes QC, QC_N. A value stored in the cache latch 296 can be reset by the reset signal CRST. The sense line SO is coupled to the memory cell 402, A value read and transferred from the memory cell 402 can be stored in the data latch 294 or the cache latch 296 through the control signals TRAN2, TRANC_N, TRANC.

Although all the memory cell 402, the data latch 294, and the cache latch 296 are coupled through the same sense line SO, an additional line (L1) connecting the data latch 294 and the cache latch 296 can be included in the memory device 150. Connection between the data latch 294 and the cache latch 296 via the additional line can be controlled by a transmission control signal TRAN2C.

Because the data latch 294 and the cache latch 296 can be connected by the transmission control signal TRAN2C via the additional line L1 besides the sense line SO, an operation for transferring the hard decision data entry or the soft decision data entry from the data latch 294 to the cache latch 296 can be performed independently of or in parallel with another operation. For example, when there are two data latches 294 coupled to the single memory cell 402 through the sense line SO (e.g., when the memory device 150 described in FIG. 8 includes a plurality of sensing latches 404A, 404B), the hard decision data entry obtained from the memory cell 402 can be stored in the cache latch 296 through a first sensing latch 404A, and the soft decision data entry can be read from the memory cell 402 and stored in a second sensing latch 404B, While the soft decision data entry is obtained from the memory cell 402 and stored in the second data latch 404B, the hard decision data entry previously stored in the first data latch 404A can be transferred to the cache latch 296 through the additional line L1.

As in the embodiment described with reference to FIG. 8, when two data latches and one cache latch are included in the memory device 150, an operation for transferring data from one of the data latches 404A, 404B to the cache latch 296 can be performed in parallel with either another operation for obtaining data from the memory cell 402 or another operation for outputting the hard decision data entry or the soft decision data entry from the cache latch 296 through input/output lines BITOUTB, BITOUT, in response to a cache transmission signal CS. Accordingly, an input/output operation speed in the memory device 150 can be improved based on a structure including the plurality of data latches 294 arranged corresponding to the single memory cell 402 in the second page buffer circuit 320B.

Figure 12:
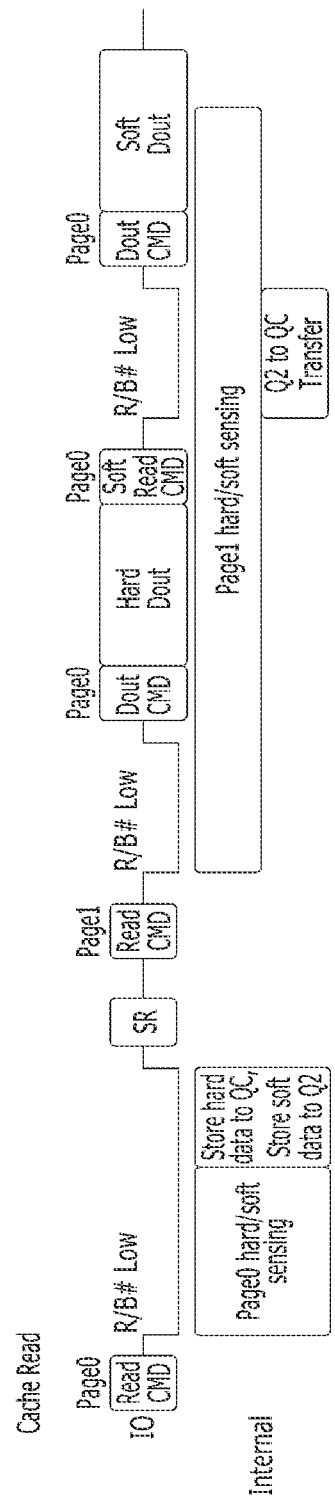
FIG. 12 illustrates an example of an operation for outputting hard decision data and soft decision data from the page buffer circuit shown in FIG. 11.

FIG. 12 illustrates an operation for outputting a hard decision data entry and a soft decision data entry from the page buffer circuit shown in FIG. 11. The read operation can be divided into an operation (Internal) performed inside the memory device 150 and an operation (JO) performed between the memory device 150 and the controller 130.

Also, FIG. 12 illustrates an operation for outputting hard decision data entry and the soft decision data entry during sequential read operations (sequential read, cache read). A sequential read operation (sequential read, cache read) can be performed on a first page Page0 and a second page Page1 adjacent to each other. The first page Page0 and the second page Page1 can share a same bit line or a same sense line SO (e.g., shown in FIG. 11), so that the first page Page0 and the second page Page1 can be coupled to a same data latch and a same cache latch through the same sense line SO.

Referring to FIG. 12, when a read command Read CMD regarding a first page Page0 is input to the memory device 150, the control circuitry 180 in the memory device 150 can change a status signal R/B # to a predetermined level, e.g., a logic low level. The control circuitry 180 can perform a sensing operation for obtaining a hard decision data entry and a soft decision data entry from the first page Page0 (Page0 hard/soft sensing). The hard decision data entry can be transferred from the first sensing latch 404A to the cache latch 406, and the soft decision data entry can be stored in the second sensing latch 404B (Store hard data to QC, Store soft data to Q2).

The controller 130 can check state information of the memory device 150, and the memory device 150 can check whether the hard decision data entry and the soft decision data entry are secured through a read operation on the first page Page0 (SR).

The controller 130 can further transmit a read command (Read CMD) regarding the second page Page1 to the memory device 150. The control circuitry 180 in the memory device 150 can set the state signal R/B # to a predetermined level, e.g., a logic low level. In response to the read command (Read CMD), the control circuitry 180 can perform a sensing operation for obtaining a hard decision data entry and a soft decision data entry from the second page Page1 (Page1 hard/soft sensing).

Because the memory device 150 has not yet output the hard decision data entry and the soft decision data entry regarding the first page Page0 to the controller 130, the memory device 150 does not have to quickly perform an operation for obtaining the hard decision data entry and the soft decision data entry regarding the second page Page1 (e.g., an operation margin for obtaining the hard decision data entry and the soft decision data entry regarding the second page Page1 has time on a side of the memory device 150). The operation of the memory device 150 to obtain the hard decision data entry and the soft decision data entry regarding the second page Page1 together or consecutively can be performed, while the hard decision data entry and the soft decision data entry regarding the first page Page0 are output to the controller 130. This sensing operation regarding the second page Page1 might not deteriorate data input/output performance of the memory device 150.

When the data output command (Dout CMD) regarding the first page Page0 is input, the memory device 150 can output the hard decision data entry previously stored in the cache latch 406 (Hard Dout), After securing the hard decision data entry regarding the first page Page0, the controller 130 can transmit a soft decision data read command (Soft Read CMD) to the memory device 150 to secure the soft decision data entry regarding the first page Page0.

According to an embodiment, the controller 130 can check and correct an error in a data entry transmitted from the memory device 150 based on the hard decision data entry. If an error is not found in the data or the error is corrected, an operation corresponding to the read command (Read CMD) regarding the first page Page0 could be terminated. If an error is found in the data and the error is not corrected, the controller 130 can transmit the soft decision data read command (Soft Read CMD) regarding the first page Page0 to the memory device 150.

When the soft decision data read command (Soft Read CMD) is input, the control circuitry 180 in the memory device 150 can set the status signal R/B # to a predetermined level, e.g., a logic low level, Because the memory device 150 has already secured the soft decision data entry regarding the first page Page0, the memory device 150 can read and store the hard decision data entry (Hard Data) and the soft decision data entry (Soft Data) regarding the second page Page1 together or consecutively. Further, the soft decision data entry regarding the first page Page0 stored in the second sensing latch 404B can be transferred to the cache latch 406 (Q2 to QC Transfer).

When the controller 130 transfers the data output command (Dout CMD), the memory device 150 can output the soft decision data entry regarding the first page Page0 (Soft Dout). The control circuitry 180 can perform a sensing operation for obtaining the hard decision data entry and the soft decision data entry from the second page Page1 (Page1 hard/soft sensing).

Figure 13:
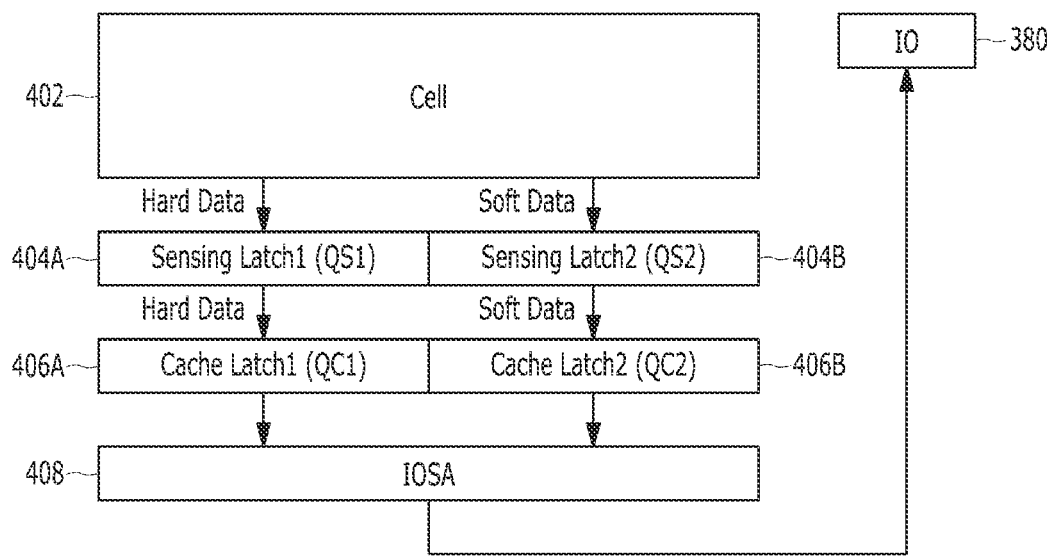
FIG. 13 illustrates an embodiment of a memory device.

Referring to FIG. 13, the memory device 150 can include the plurality of sensing latches 404A, 404B and one or more cache latches 406 arranged for the single memory cell 402 (or a single bit line or a single sensing line). The memory device 150 can perform internal operations for reading and transferring hard decision data entry and the soft decision data entry in parallel within the memory device 150, during sequential read operations (sequential read, cache read), Because the internal operations for sensing and outputting the hard decision data entries and the soft decision data entries according to sequential read (cache read) operations can be performed in parallel, the memory device 150 can reduce a delay occurring in sensing and outputting the hard decision data entry and the soft decision data entry during the sequential read operations, FIG. 13 illustrates an embodiment of memory device 150, which can include a memory cell 402, a plurality of sensing latches 404A, 404B, a plurality of cache latches 406A, 406B, an input/output sense amplifier 408, and an input/output control circuit 380. The memory cell 402 can be included in the cell array 330 described with reference to FIGS. 3 to 4. The sensing latches 404A, 404B can correspond, for example, to the data latch 294 described in FIG. 1, the page buffer 322 described in FIG. 3, and the data register 254 described in FIG. 4. The cache latch 406 can correspond to the cache latch 296 described in FIG. 1 and the cache register 256 described in FIG. 4.

The memory device 150 can obtain the hard decision data entry and the soft decision data entry together or consecutively from the memory cell 402. The memory device 150 can include a plurality of sensing latches 404A, 404B arranged for the single memory cell 402, For example, the hard decision data entry can be obtained from the memory cell 402 and stored in the first sensing latch 404A, while the soft decision data entry can be obtained from the memory cell 402 and stored in the second sensing latch 4043. The hard decision data entry and the soft decision data entry individually stored in the sensing latches 404A, 404B can be sequentially transferred to the cache latches 406A, 4063. The hard decision data entry and the soft decision data entry stored in the cache latches 406A, 4063 can be sensed and amplified through the input/output sense amplifier 408 and transmitted to the input/output control circuit 380.

Because the memory device 150 includes the sensing latches 404A, 4043 and the cache latches 406A, 4063 arranged for the single memory cell 402, the memory device 150 may be able to more easily store and transmit the hard decision data entry and soft decision data entry than the embodiment shown in FIG. 8.

Figure 14:
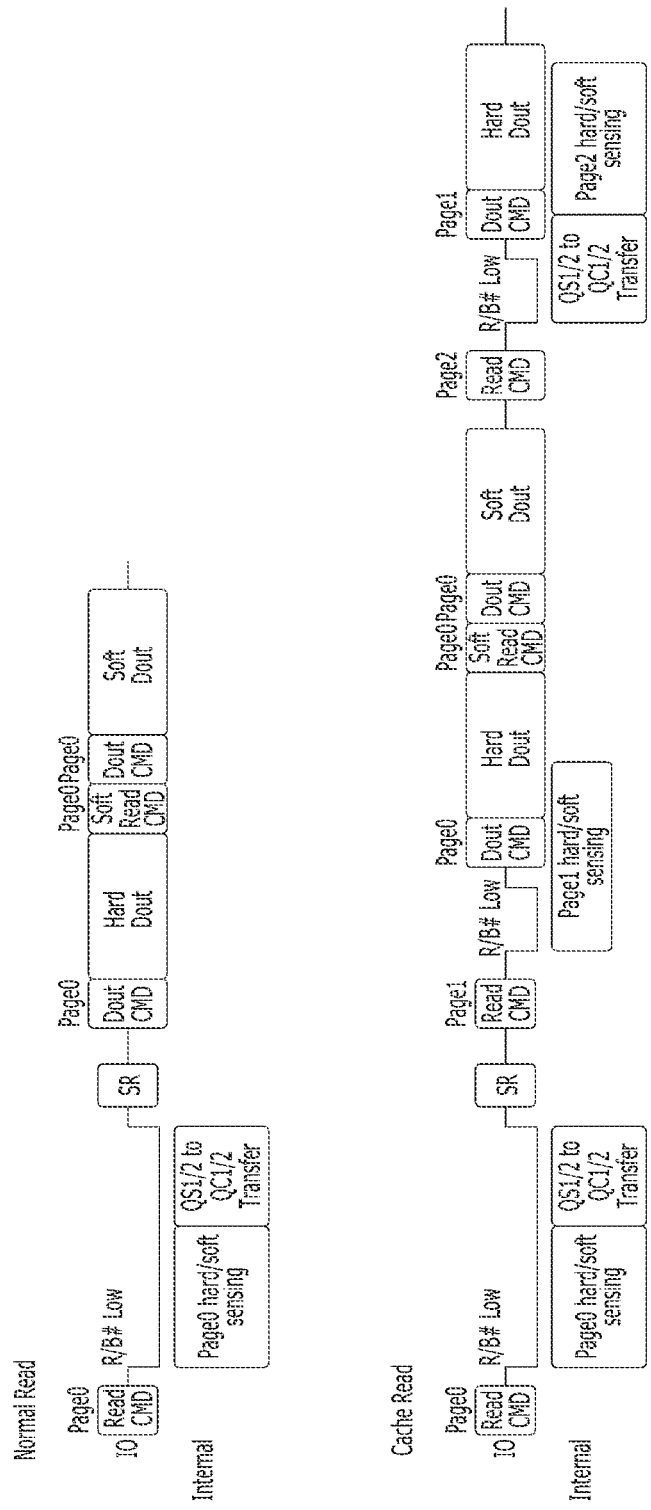
FIG. 14 illustrates an example of an operation for outputting hard decision data and soft decision data from the memory device shown in FIG. 13.

FIG. 14 illustrates an embodiment of an operation for outputting hard decision data and soft decision data from the memory device shown, for example, in FIG. 13. The read operation can be divided into an operation (Internal) performed inside the memory device 150 and an operation (IQ) performed between the memory device 150 and the controller 130.

In FIG. 14, two cases are shown: one is a random read operation regarding the first page Page0 included in the memory device 150 (Norm& Read), and the other is a sequential read operation regarding the first page Page0 to the third page Page2 in the memory device 150 (Cache Read).

In the random read operation (Normal Read), the controller 130 can transmit a read command (Read CMD) regarding the first page Page0 to the memory device 150. When the read command (Read CMD) regarding the first page Page0 is input to the memory device 150, the control circuitry 180 in the memory device 150 can change a status signal R/B # to, for example, a logic low level. The control circuitry 180 can perform a sensing operation for obtaining a hard decision data entry and a soft decision data entry from the first page Paget) (Page0 hard/soft sensing). The hard decision data entry can be transferred from a first sensing latch 404A to a first cache latch 406A, while the soft decision data entry can be transferred from a second sensing latch 404B to a second cache latch 406B (QS1/2 to QC1/2 Transfer).

The controller 130 can check state information of the memory device 150, and the memory device 150 can check whether the hard decision data entry and the soft decision data entry are secured through a read operation regarding the first page Page0 (SR). When a data output command (Dout CMD) regarding the first page Page0 is input, the memory device 150 can output the hard decision data entry stored in the cache latch 406 to the controller 130 (Hard Dout).

After securing the hard decision data entry regarding the first page Page0 the controller 130 can transmit a soft decision data read command (Soft Read CMD) to the memory device 150, in order to secure the soft decision data entry regarding the first page Paget). When the soft decision data read command (Soft Read CMD) is input, the memory device 150 can transfer the soft decision data entry secured from the first page Page0 from the second sensing latch 404B to the second cache latch 4066. When the data output command (Dout CMD) regarding the first page Page0 is input, the memory device 150 can output the soft decision data entry stored in the second cache latch 406B to the controller 130 (Soft Dout).

Referring to FIG. 13, the memory device 150 can include the plurality of sensing latches 404A, 404B and the plurality of cache latches 406A, 406B which are arranged for the single memory cell 402. The memory device 150 can obtain the hard decision data entry and the soft decision data entry together or consecutively from the memory cell 402, store the hard decision data entry and the soft decision data entry in different sensing latches 404A, 404B, and transmit the hard decision data entry and the soft decision data entry from different sensing latches 404A, 404B to the different cache latches 406A, 406B, Therefore, when an error is included in a data entry output from the first page Page0, the time for the controller 130 to receive the soft decision data entry (Soft Data) could be reduced.

In the case of sequential read operations (Cache Read), when a read command (Read CMD) regarding the first page Page0 is input to the memory device 150, the control circuitry 180 in the memory device 150 can set a status signal R/B # to a predetermined level, e.g., a logic low level. The control circuitry 180 can perform a sensing operation for obtaining the hard decision data entry and the soft decision data entry from the first page Page0 (Page0 hard/soft sensing), The hard decision data entry can be transferred from a first sensing latch 404A to a first cache latch 406A, while the soft decision data entry can be transferred from a second sensing latch 404B to a second cache latch 406B (QS1/2 to QC1/2 Transfer).

The controller 130 can check state information of the memory device 150, and the memory device 150 can check whether the hard decision data entry and the soft decision data entry are secured through a read operation regarding the first page Page0 (SR).

The controller 130 can transmit a read command (Read CMD) regarding the second page Page1 to the memory device 150. The control circuitry 180 in the memory device 150 can set the state signal R/B # to a predetermined level, e.g., a logic low level. The control circuitry 180 can perform a sensing operation for obtaining the hard decision data entry and the soft decision data entry from the second page Page1 (Page1 hard/soft sensing). When the plurality of sensing latches 404A, 404B and the plurality of cache latches 406A, 406B are included in the memory device 150, both the hard decision data entry and the soft decision data entry regarding the first page Page0 can be transferred from the sensing latches 404A, 404B to the cache latches 406A, 406B. After both the hard decision data entry and the soft decision data entry regarding the first page Page0 are moved from the sensing latches 404A, 404B to the cache latches 406A, 406B, the memory device 150 can store the hard decision data entry and the soft decision data entry, which have been obtained from the second page Page1, in the sensing latches 404A, 404B.

When a data output command (Dout CMD) regarding the first page Page0 is input, the memory device 150 can output the hard decision data entry stored in the first cache latch 406A (Hard Dout). Thereafter, the controller 130 can secure the hard decision data entry regarding the first page Page0 and then transfer a soft decision data read command (Soft Read CMD) to the memory device 150 so as to secure the soft decision data entry regarding the first page Page0.

When the soft decision data read command (Soft Read CMD) is input, the memory device 150 can have secured the hard decision entries and the soft decision data entries regarding the first page Page0 and the second page Page1, so that the memory device 150 does not need to set the status signal R/B # to a predetermined level, e.g., a logic low level. The controller 130 can transmit a data output command (Dout CMD) for the first page Page0, and then the memory device 150 can output the soft decision data entry for the first page Page0 (Soft Dout).

The controller 130 can transmit a read command (Read CMD) regarding the third page Page2 to the memory device 150. The memory device 150 can set the status signal R/B # to a predetermined level, e.g., a logic low level, Because the memory device 150 have output both the hard decision data entry and the soft decision data entry regarding the first page Page0 to the controller 130, the hard decision data entry and the soft decision data entry regarding the second page Page1 can be transferred from the sensing latches 404A, 404B to the cache latches 406A, 4063 (QS1/2 to QC1/2 transfer), After the sensing latches 404A, 4043 become available, the memory device 150 can obtain the hard decision data entry and the soft decision data entry from the third page Page2 together or consecutively (Page2 hard/soft sensing). When the controller 130 transmits the data output command (Dout CMD) to the memory device 150, the memory device 150 can output the hard decision data entry regarding the second page Page0 to the controller 130 (Hard Dout).

Figure 15:
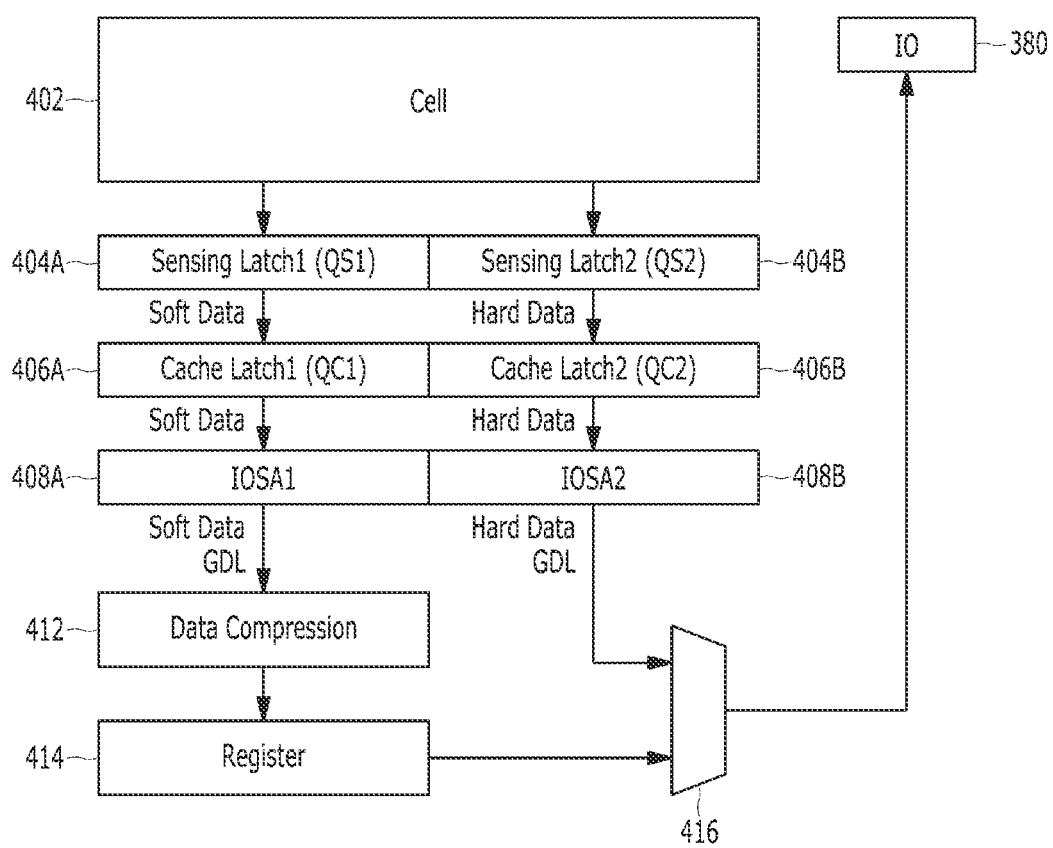
FIG. 15 illustrates an embodiment of a memory device.

Referring to FIG. 14, in the case when the memory device 150 includes the plurality of sensing latches 404A, 404B and the plurality of cache latches 406A, 406B arranged for the single memory cell 402, the memory device 150 can perform internal operations of the memory device 150 in parallel, such as an operation for obtaining the hard decision data entry and the soft decision data entry from a plurality of memory cells and an operation of outputting the hard decision data entry and the soft decision data entry in response to sequential read operations (sequential read, cache read) as well as read operations (Normal Read). Accordingly, a delay in sensing and outputting the hard decision data entry and the soft decision data entry in a random read operation (Normal Read) and a sequential read operation (sequential read, cache read) could be reduced, FIG. 15 illustrates an embodiment of memory device 150, which can include a memory cell 402, a plurality of sensing latches 404A, 404B, a plurality of cache latches 406A, 406B, a plurality of input/output sense amplifiers 408A, 408B, and an input/output control circuit 380. The memory cell 402 can be included in the cell array 330 shown in FIGS. 3 to 4, The sensing latches 404A, 404B can correspond to the data latch 294 described in FIG. 1, the page buffer 322 described in FIG. 3, and the data register 254 described in FIG. 4. The cache latch 406 can correspond to the cache latch 296 described in FIG. 1 and the cache register 256 described in FIG. 4.

The memory device 150 can obtain the hard decision data entry and the soft decision data entry together or consecutively from the memory cell 402. The memory device 150 can include the sensing latches 404A, 4040 arranged for the single memory cell 402. For example, the hard decision data entry obtained from the memory cell 402 can be stored in the second sensing latch 404B, while the soft decision data entry obtained from the memory cell 402 can be stored in the first sensing latch 404A. The hard decision data entry and the soft decision data entry stored in the sensing latches 404A, 404E can be individually transferred to the cache latches 406A, 406B, The hard decision data entry and the soft decision data entry stored in the cache latches 406A, 406B can be sensed and amplified individually by the plurality of input/output sense amplifiers 408A, 4086 and transmitted to the input/output control circuit 380.

The memory device 150 can further include a data compression circuit 412 capable of compressing the soft decision data entry. The data compression circuit 412 coupled to the first input/output sense amplifier 408A sensing and amplifying the soft decision data entry can compress the soft decision data entry, and the compressed soft decision data entry compressed by the data compression circuit 412 can be stored in a register 414, According to an embodiment, the data compression circuit 412 can compress the soft decision data entry through a run-length encoding (RLE). Run-length encoding (RLE) is a sort of simple lossless compression method that expresses successive occurrences of the same value in data only with the number and repeated values. For example, through run-length encoding (RLE), a compressed data entry can be represented only by the number of consecutive '1's or the number of consecutive '0's appearing in the data entry. The data compression circuit 412 can set a size of the compressed soft decision data entry to be constant. For example, the data compression circuit 412 can compress a 384-bit soft decision data entry into a 64-bit compressed soft decision data entry (e.g., Data Compression Ratio is 1:6).

The memory device 150 can include a multiplexer 416, coupled to the second input/output sense amplifier 408B and the register 414, to selectively transmit either the hard decision data entry or the compressed soft decision data entry to the input/output control circuit 380.

Because the memory device 150 includes a plurality of sensing latches 404A, 404B and the plurality of cache latches 406A, 4068 arranged for the single memory cell 402 in the memory device 150, the memory device 150 may be able to store and transmit the hard decision data entry and the soft decision data entry more easily than the embodiment shown in FIG. 8. In addition, because the memory device 150 includes the plurality of input/output sense amplifiers 408A, 408B, the multiplexer 416 could be used for selecting one of the outputs of the input/output sense amplifiers 408A, 4088 and for transferring a selected one through an input/output line coupled to the input/output control circuit 380. By distinguishing data paths for processing the hard decision data entry and the soft decision data entry, the memory device 150 can avoid slowing an input/output speed of the hard decision data entry due to an operation for compressing the soft decision data entry. Further, the memory device 150 can secure an operation margin for compressing the soft decision data entry.

Figure 16:
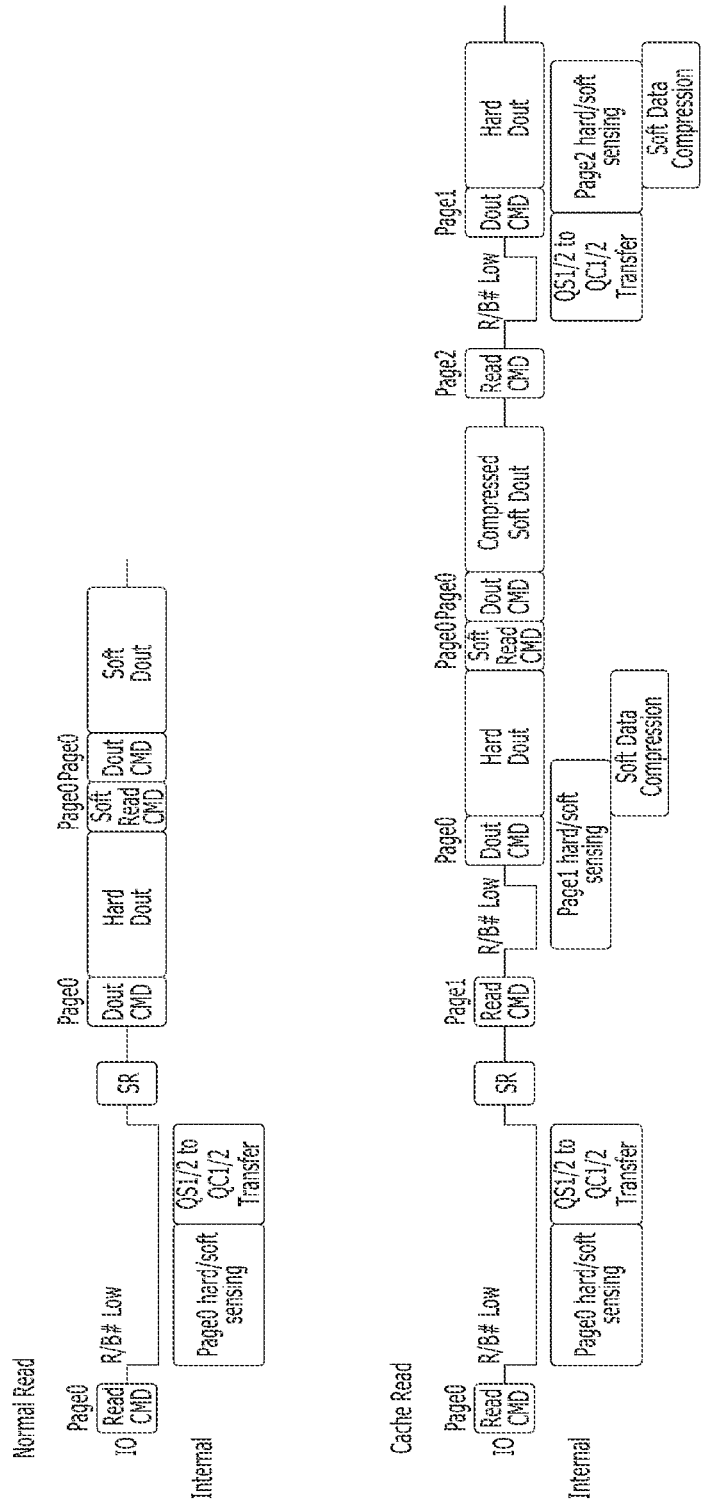
FIG. 16 illustrates an example of an operation for outputting hard decision data and soft decision data from the memory device shown in FIG. 15.

FIG. 16 illustrates an operation for outputting hard decision data and soft decision data from the memory device shown in FIG. 15. The read operation can be divided into an operation (Internal) performed inside the memory device 150 and an operation (IO) performed between the memory device 150 and the controller 130. Similar to FIG. 14, FIG. 16 shows two cases: one is a random read operation (Normal Read) regarding the first page Page0 in the memory device 150, and the other is a sequential read operation (Cache read) regarding the first page Page0 to the third page Paget.

In the random read operation (Normal Read), the controller 130 can transmit a read command (Read CMD) regarding the first page Page0 to the memory device 150. When the read command (Read CMD) regarding the first page Page0 is input to the memory device 150, the control circuitry 180 in the memory device 150 can set the status signal R/B # to a predetermined level, e.g., a logic low level. The control circuitry 180 can perform a sensing operation for obtaining the hard decision data entry and the soft decision data entry from the first page Page0 (Page0 hard/soft sensing), The hard decision data entry and the soft decision data entry can be individually transferred from the second sensing latch 404B and the first sensing latch 404A to the second cache latch 406E and the first cache latch 406A (QS1/2 to QC1/2 Transfer).

The controller 130 can check state information of the memory device 150, and the memory device 150 can check whether the hard decision data entry and the soft decision data entry are secured through a read operation regarding the first page Page0 (SR). When the data output command (Dout CMD) regarding the first page Page0 is input, the memory device 150 can output the hard decision data entry stored in the cache latch 406 to the controller 130 (Hard Dout).

After securing the hard decision data entry regarding the first page Page0, the controller 130 can transmit a soft decision data read command (Soft Read CMD) to the memory device 150 in order to secure the soft decision data entry regarding the first page Page0. When a soft decision data read command (Soft Read CMD) is input, the memory device 150 can transfer the soft decision data entry sensed from the first page Page0 to the second cache latch 4068. When the data output command (Dout CMD) regarding the first page Page0 is input, the memory device 150 can output the soft decision data entry stored in the second cache latch 406B to the controller 130 (Soft Dout).

Referring to FIG. 15, the memory device 150 includes the plurality of sensing latches 404A, 404B and the plurality of cache latches 406A, 406E arranged for the single memory cell 402. The memory device 150 can obtain the hard decision data entry and the soft decision data entry together or consecutively from the memory cell 402, store the hard decision data entry and the soft decision data entry in different sensing latches 404A, 404B, and transmit the hard decision data entry and the soft decision data entry to the controller 130 through the different cache latches 406A, 4063. Therefore, when an error is included in a data entry output from the first page Page0, a time for the controller 130 to receive the soft decision data entry (Soft Data) could be reduced.

In the sequential read operation (Cache Read), when a read command (Read CMD) regarding the first page Page0 is input to the memory device 150, the control circuitry 180 in the memory device 150 can set the status signal R/B # to a predetermined level, e.g., a logic low level. The control circuitry 180 can perform a sensing operation for obtaining the hard decision data entry and the soft decision data entry from the first page Page0 (Page0 hard/soft sensing). The hard decision data entry and the soft decision data entry can be individually transferred from the second sensing latch 404B and the first sensing latch 404A to the second cache latch 4063 and the first cache latch 406A (QS1/2 to QC1/2 Transfer).

The controller 130 can check state information of the memory device 150, and the memory device 150 can check whether the hard decision data entry and the soft decision data entry are secured through a read operation regarding the first page Page0 (SR).

The controller 130 can transmit a read command (Read CMD) regarding the second page Page1 to the memory device 150, The control circuitry 180 in the memory device 150 may set the state signal R/B # to a predetermined level, e.g., a logic low level. The control circuitry 180 can perform a sensing operation for obtaining the hard decision data entry and the soft decision data entry from the second page Page1 (Page1 hard/soft sensing). When the plurality of sensing latches 404A, 404B and the plurality of cache latches 406A, 4068 are included in the memory device 150, the hard decision data entry and the soft decision data entry obtained from the first page Page0 can be transferred individually from the plurality of sensing latches 404A, 4048 to the plurality of cache latches 406A, 406B, After the hard decision data entry and the soft decision data entry regarding the first page Page0 are moved from the plurality of sensing latches 404A, 4048 to the plurality of cache latches 406A, 4068, the memory device 150 can store the hard decision data entry and the soft decision data entry obtained from the second page Page1 in the plurality of sensing latches 404A, 404B.

When the data output command (Dout CMD) regarding the first page Page0 is input, the memory device 150 can output the hard decision data entry stored in the first cache latch 406A to the controller 130 (Hard Dout). While the hard decision data entry regarding the first page Page0 is output, the soft decision data entry regarding the first page Page0 can be compressed (Soft Data Compression). After securing the hard decision data entry regarding the first page Page0, the controller 130 can transfer a soft decision data read command (Soft Read CMD) to the memory device 150 in order to secure the soft decision data entry regarding the first page Page0, When the soft decision data read command (Soft Read CMD) is input, the memory device 150 has already secured the hard decision data entries and the soft decision data entries regarding the first page Page0 and the second page Page1, so that the memory device 150 does not need to set the status signal R/B # to a logic low level. The controller 130 can transmit the data output command (Dout CMD) regarding the first page Page0, and the memory device 150 can output the compressed soft decision data entry regarding the first page Page0 to the controller 130 (Compressed Soft Dout).

The controller 130 can transmit a read command (Read CMD) regarding the third page Page2 to the memory device 150. The memory device 150 can set the status signal R/B # to a predetermined level, e.g., a logic low level. Because the memory device 150 has output both hard decision data and soft decision data regarding the first page Page0 to the controller 130, the hard decision data entry and the soft decision data entry regarding the second page Page1 can be moved from the sensing latches 404A, 4048 to the cache latches 406A, 406B (QS1/2 to QC1/2 transfer), After the sensing latches 404A, 4048 become available, the memory device 150 can obtain the hard decision data entry and the soft decision data entry together or consecutively from the third page Page2 (Page2 hard/soft sensing). When the controller 130 transmits the data output command (Dout CMD), the memory device 150 can output the hard decision data entry regarding the second page Page1 to the controller 130 (Hard Dout), While the hard decision data entry regarding the second page Page1 is output, the soft decision data entry regarding the second page Page1 can be compressed (Soft Data Compression).

Referring to FIG. 16, the memory device 150 includes the plurality of sensing latches 404A, 4046, the plurality of cache latches 406A, 4066, and the plurality of input/output sense amplifiers 408A, 4086 which are arranged for the single memory cell 402. The memory device 150 can perform internal operations in parallel not only in the random read operation (Normal Read) but also in the sequential read operation (Cache read). While sensing or outputting a hard decision data entry and a soft decision data entry from a plurality of memory cells, the memory device 150 can transfer another hard decision data entry and another soft decision data entry or compress the soft decision data entry. Accordingly, a delay in outputting a hard decision data entry and a soft decision data entry can be reduced during the random read operation (Normal Read) or the sequential read operation (Cache read).

Figure 17:
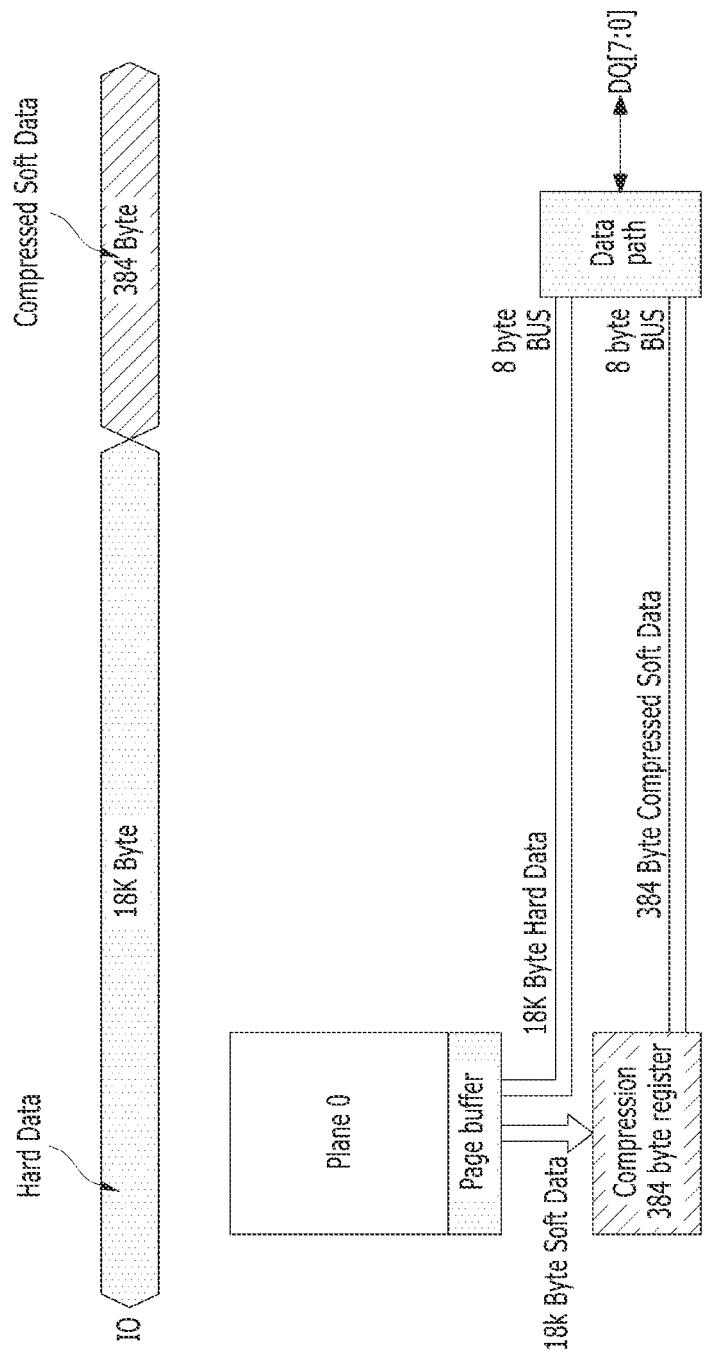
FIG. 17 illustrates an embodiment of a method for outputting hard decision data and soft decision data from a memory device.

FIG. 17 illustrates an embodiment of a method for outputting a hard decision data entry and a soft decision data entry from a memory device.

Referring to FIG. 17, a hard decision data entry and a soft decision data entry output from a memory plane Plane0 can be output through a page buffer. The memory plane Plane0 can be included in the cell array 330 described with reference to FIG. 3. The page buffer can correspond to the page buffer circuit 320 described with reference to FIG. 3.

The hard decision data entry and the soft decision data entry output from the memory plane Plane0 can have a size of 18 k bytes. The hard decision data entry can be output through a data path without being compressed. The data path can be associated with the input/output control circuit 380 and the channels I/O[7:0] described with reference to FIG. 4. In FIG. 17, a case in which the memory device 150 and the controller 130 are communicated via a channel having a width of 1 byte (8 bits) is described as an example. After the hard decision data entry output from the memory plane Plane0 is output to the controller 130, the compressed soft decision data can be output.

Figure 18:
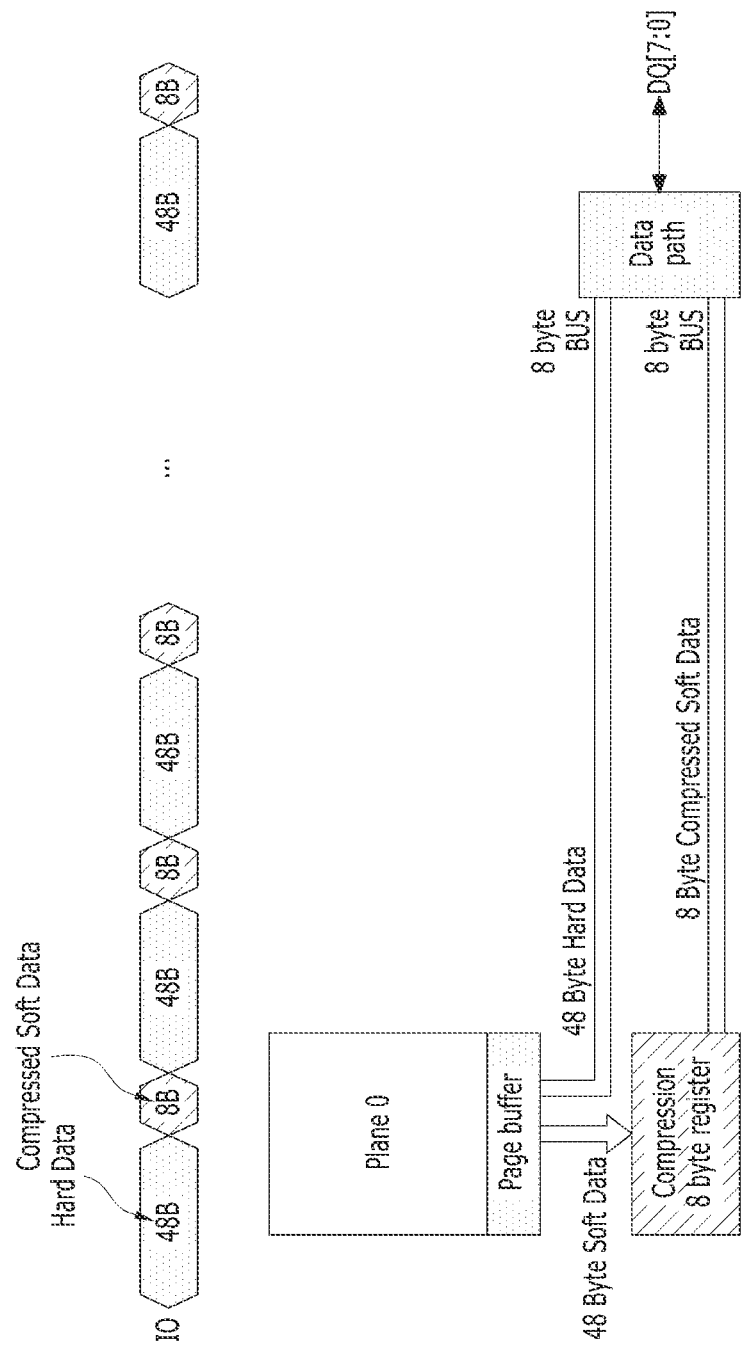
FIG. 18 illustrates an embodiment of a method for outputting hard decision data and soft decision data from a memory device.

FIG. 18 illustrates an embodiment of a method for outputting a hard decision data entry and a soft decision data entry from a memory device. FIG. 18 provides an example of outputting a hard decision data entry and a soft decision data entry having the same size, like an embodiment shown in FIG. 17.

Referring to FIG. 18, the hard decision data entry and the soft decision data entry output from the memory plane Plane0 can be transmitted separately in a size of 48 bytes. The memory device 150 can compress a 48-byte soft decision data entry into an 8-byte compressed soft decision data entry suitable for being transmitted via the channel having the same width.

Referring to FIGS. 17 and 18, the size of internal components can be different according to an operation of outputting or compressing the hard decision data entry and the soft decision data entry. As the size of the hard decision data entry and the soft decision data entry to be output increases, the memory device 150 can include a larger size register configured to temporarily store the hard decision data entry, the soft decision data entry, or the compressed soft decision data entry.

On the other hand, as the size of the hard decision data entry and the soft decision data entry to be output decreases, the memory device 150 can reduce the size of latches and registers configured to temporarily store the hard decision data entry, the soft decision data entry, or the compressed soft decision data entry. On the other hand, as in the memory device 150 described with reference to FIG. 15, in order to perform operations of sensing, transferring, and compressing a data entry in the memory device 150 in parallel, a plurality of sensing latches, a plurality of cache latches and a plurality of input/output amplifiers can be arranged corresponding to the single memory cell (or a single bit line) in the memory 150.

Figure 19:
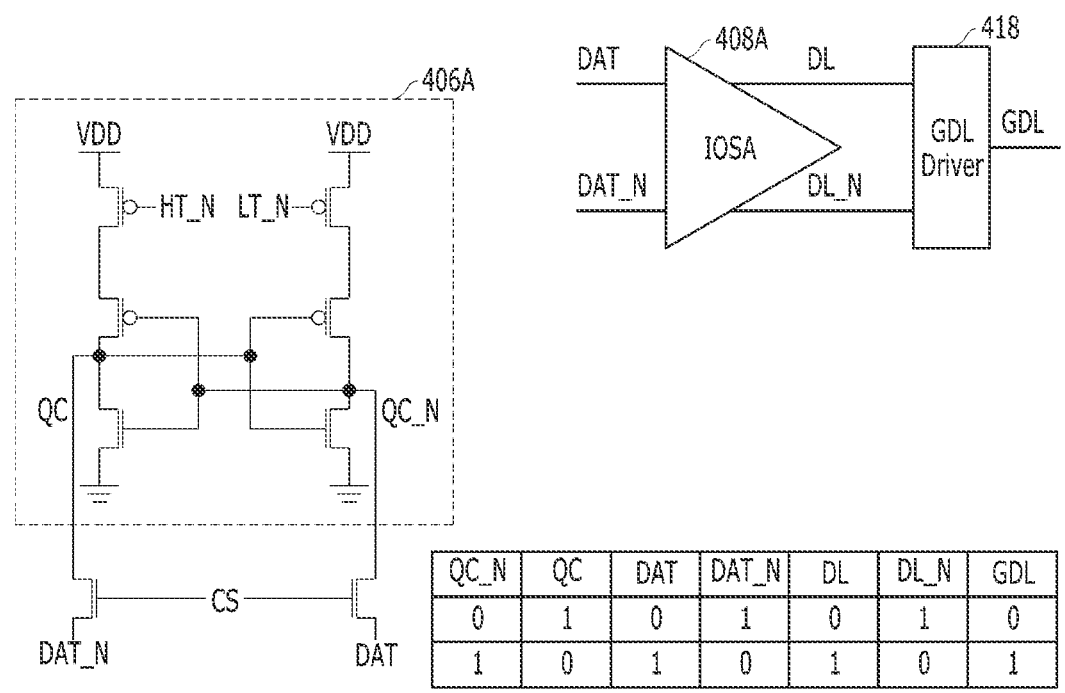
FIG. 19 illustrates an embodiment of a sense amplification circuit included in a memory device.

FIG. 19 illustrates an embodiment of a sense amplification circuit included in a memory device.

Referring to FIG. 19, the input/output sense amplifier 408A may be coupled to the cache latch 406A and the input/output line (GDL) driver 418. The two nodes QC, QC_N of the cache latch 406A can be connected to input terminals DAT, DAT_N of the input/output sense amplifier 408A in response to the control signal CS. The input/output sense amplifier 408A can output data transmitted through the input terminals DAT, DAT_N to output terminals DL, DL_N.

The cache latch 406A and the input/output sense amplifier 408A can have a structure for inputting and outputting 1-bit data and 1-bit inverted data. For example, when a value of the first node QC in the cache latch 406A is '1', a value of the second node QC_N which is the inversion node in the cache latch 406A is '0'. The first node QC of the cache latch 406A is coupled to the inverted input terminal DAT_N of the input/output sense amplifier 408A, and the second node QC_N of the cache latch 406A is coupled to the input terminal DAT of the input/output sense amplifier 408A. The input/output sense amplifier 408A can sense and amplify the value of '0' input through the input terminal DAT to output the value of '0' to the output terminal DL, and sense and amplify the value of '1' input through the inverted input terminal DAT_N to output the value of '1' to the inverted output terminal DL_N. Based on the output terminal DL of the input/output sense amplifier 408A, the input/output line (GDL) driver can maintain the input/output line GDL as a value of '0'.

When the value of the first node QC in the cache latch 406A is '0', the value of the second node QC_N that is the inversion node in the cache latch 406A would be '1'. The first node QC of the cache latch 406A is coupled to the inverted input terminal DAT_N of the input/output sense amplifier 408A. The second node QC_N of the cache latch 406A is coupled to the input terminal DAT of the input/output sense amplifier 408A. The input/output sense amplifier 408A can sense and amplify the value of '1' input through the input terminal DAT to output the value of '1' to the output terminal DL, and can sense and amplify the value of '0' input through the inverted input terminal DAT_N to output the value of '0' to the inverted output terminal Based on the output terminal DL of the input/output sense amplifier 408A, the input/output line (GDL) driver can maintain the input/output line GDL as a value of T.

Figure 20:
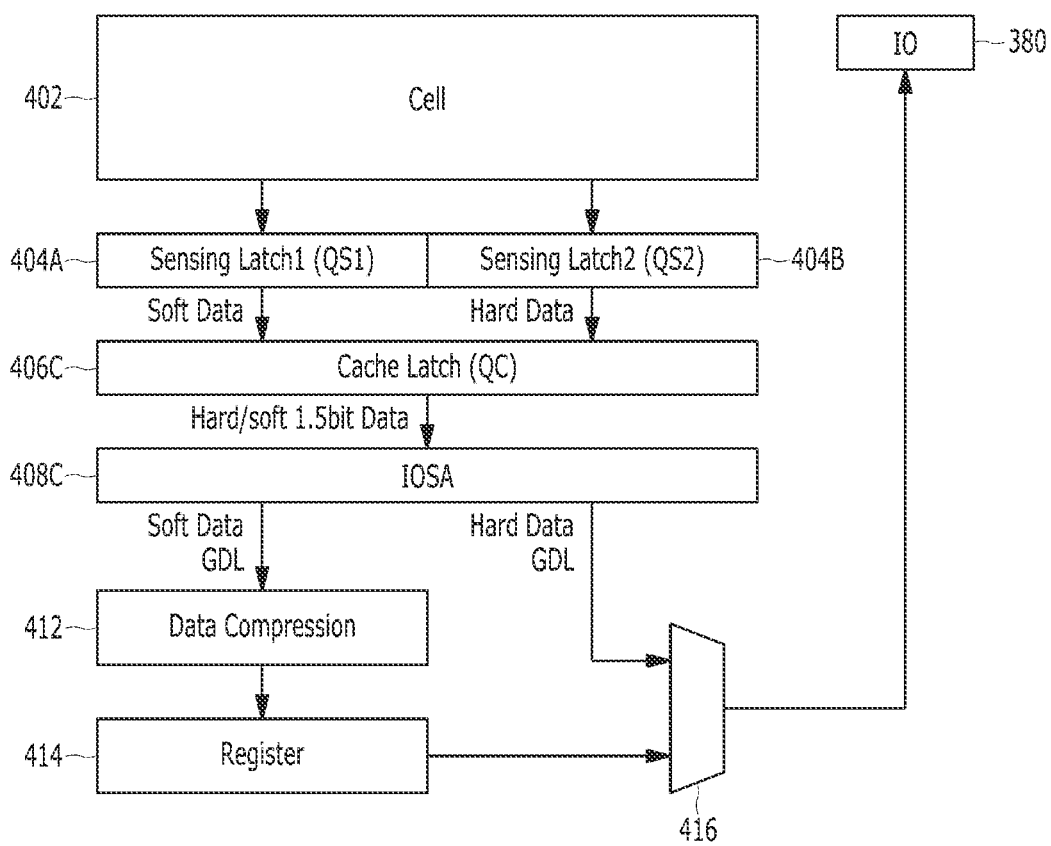
FIG. 20 illustrates an embodiment of a memory device.

FIG. 20 illustrates an embodiment of a memory device 150, which may look like the memory device 150 described with reference to FIG. 15, but the configuration and operation of the cache latch 406C and the input/output sense amplifier 408C are different.

In the memory device 150 described with reference to FIG. 15, the hard decision data entry and the soft decision data entry are separated from each other and individually transmitted as 1-bit data, but the cache latch 406C in the memory device 150 described with reference to FIG. 20 can transmit both the hard decision data entry and the soft decision data entry simultaneously. The cache latch 406C can combine the hard decision data entry and the soft decision data entry to be represented with 1,5-bit data instead of 1-bit data. In one embodiment, the 1-bit data can represent two statuses of data (e.g., '0' or '1'), but 1.5-bit data can indicate three statuses of data.

When the cache latch 406C can express three statuses of data, the hard decision data entry and the soft decision data entry can be combined and output together, so that the single cache latch 406C arranged for the single memory cell 402 could be sufficient (e.g., a plurality of cache latches might be not necessary). After individually storing the hard decision data entry and the soft decision data entry in the plurality of sense latches 404A, 4048 arranged for the single memory cell 402, the cache latch 406C can output three statuses of data (hard/soft 1.5-bit data) based on the hard decision data entry and the soft decision data entry stored in the sense latches 404A, 4048.

When the 1-bit hard decision data and the 1-bit soft decision data entry are combined, 2-bit data might be generated. However, referring to FIG. 5, the value of '11' among 2-bit data might not occur in the memory device 150. Accordingly, the cache latch 406C can be configured to output three statuses of data (e.g., '00', '01', and '10').

In addition, the input/output sense amplifier 408C can recognize input of three statuses of data (e.g., '00', '01', and '10'), output from the cache latch 406C, and decode or separate the hard decision data entry (Hard Data GDL) and the soft decision data entry (Soft Data GDL) to be transmitted through a data line (GDL).

Figure 21:
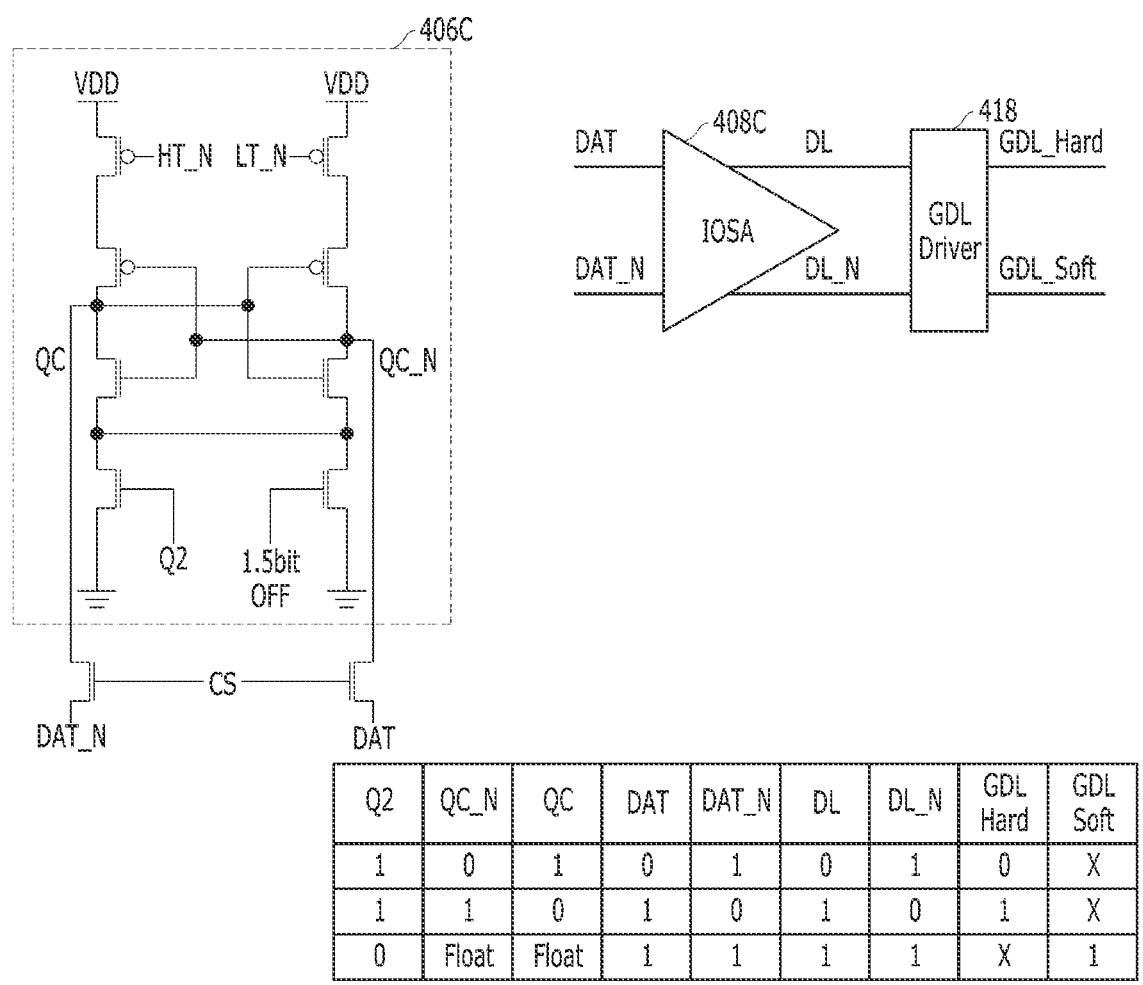
FIG. 21 illustrates an embodiment of a sense amplification circuit included in a memory device.

FIG. 21 illustrates an embodiment of a sense amplification circuit included in a memory device. Specifically, FIG. 21 describes the configuration and operation of the cache latch 406C and the input/output sense amplifier 408C included in the memory device 150 illustrated in FIG. 20.

Referring to FIG. 21, the input/output sense amplifier 408C can be coupled to the cache latch 406C and the input/output line (GDL) driver 418, The two nodes QC, QC_N of the cache latch 406C can be individually coupled to the input terminals DAT, DAT_N of the input/output sense amplifier 408C in response to the control signal CS, The input/output sense amplifier 408C can output data transmitted through the input terminals DAT, DAT_N to the output terminals DL and DL_N.

The two nodes QC, QC_N of the cache latch 406C are coupled to the first sensing latch 404A for storing the hard decision data entry, and to the cache latch 406C. The cache latch 406 can further include a first transistor coupled to the second sensing latch 404B and receiving an inversion value Q2 of the soft decision data entry and a second transistor coupled to a deactivation signal (1.5 bit OFF) controlling a 1.5-bit operation mode. The input/output sense amplifier 408A has a structure for inputting and outputting 1-bit of data and inverted data.

For example, as one of the three statues of data stored in the cache latch 406C, the inversion value Q2 of the soft decision data entry is a value of '1' and the value of the first node QC in the cache latch 406C is a value of '1'. In this case, the value of the second node QC_N, which is an inversion node in the cache latch 406C, can be a value of '0'. The first node QC of the cache latch 406C is coupled to the inverted input terminal DAT_N of the input/output sense amplifier 408A, and the second node QC_N of the cache latch 406C is coupled to the input terminal DAT of the input/output sense amplifier 408C. The input/output sense amplifier 408C can sense and amplify the value of '0' input through the input terminal DAT to output the value of '0' to the output terminal DL, and sense and amplify the value of '1' input through the inverted input terminal DAT_N to output the value of '1' to the inverted output terminal DL_N. Based on the output terminal DL of the input/output sense amplifier 408C, the input/output line (GDL) driver can output the hard decision data entry (Hard Data GDL) to be transmitted through the data line GDL as the value of '0', and output the soft decision data (Soft Data GDL) transmitted through the data line GDL as the value of don't care (X) or '0'.

As another one of the three statues of data stored in the cache latch 406C, when the inversion value Q2 of the soft decision data is a value of '1' and the value of the first node QC in the cache latch 406C is a value of '0', a value of the second node QC_N, which is an inverted node in the latch 406C, can be '1'. The first node QC of the cache latch 406C is coupled to the inverted input terminal DAT_N of the input/output sense amplifier 408C, and the second node QC_N of the cache latch 406C is coupled to the input terminal DAT of the input/output sense amplifier 408C. The input/output sense amplifier 408C can sense and amplify the value of '1' input through the input terminal DAT to output the value of '1' to the output terminal DL, and sense and amplify the value of '0' input through the inverted input terminal DAT_N to output the value of '0' to the inverted output terminal DL_N. Based on the output terminal DL of the input/output sense amplifier 408C, the input/output line (GDL) driver can output the hard decision data entry (Hard Data GDL) to be transmitted through the data line GDL as the value of '1', and output the soft decision data entry (Soft Data GDL) to be transmitted through the data line GDL as the value of don't care (X) or '0'.

As another one of the three statues of data stored in the cache latch 406C, the inversion value Q2 of the soft decision data is a value of '0' and the first node QC and the second node QC_N of the cache latch 406C are in a floating state. When the first node QC and the second node QC_N of the cache latch 406C are in a floating state, both input terminals DAT, DAT_N of the input/output sense amplifier 408C can be the value of '1'. When both input terminals DAT, DAT_N of the input/output sense amplifier 408C are the value of '1', both output terminals DL, DL_N of the input/output sense amplifier 408C have the value of '1'. Based on the two output terminals DL, DL_N of the input/output sense amplifier 408C, the input/output line (GDL) driver can output the soft decision data entry (Soft Data GDL) to be transmitted through the data line GDL as the value of '1', and output the hard decision data entry (Hard data GDL) to be transmitted through the data line GDL as the value of don't care (X) or '0'.

In the above-described manner, though the cache latch 406C performs an operation corresponding to storage and transmission of 1-bit data, the cache latch 406C can combine the hard decision data entry and the soft decision data entry to indicate three statuses of data, which correspond to three sections SEC0, SEC1, SEC2 of adjacent threshold voltage distributions which threshold voltages of the memory cells belonging to, as described in FIG. 5 (e.g., three soft/hard decision data combinations of '00', '01', and '10'), Through this procedure, a delay could be reduced, and the memory device 150 can improve a data input/output speed.

In accordance with one or more of the aforementioned embodiments, a memory system can provide an apparatus and method for reading data stored in a memory cell which is in a state in which only some, not all, bits of data are stored in the corresponding memory cell capable of storing multi-bit data. This represents an efficient use or management of internal resources because there is no need to maintain data in the data buffer provided to ensure safety of a one-shot program performed within the memory system.

In addition, in accordance with one or more embodiments, when data entries stored in non-volatile memory cells capable of storing mufti-bit data are not sufficient to completely program the multi-bit data therein, the memory system does not have to program dummy data in the corresponding non-volatile memory cells to fill the multi-bit data. Even when a partial bit data is stored in the corresponding memory cell, the memory system can read the partial bit data through a read operation, so that dummy data stored in the memory device including the non-volatile memory cells could be reduced or removed.

The methods, processes, and/or operations described herein may be performed by code or instructions to be executed by a computer, one or more processors, one or more controllers, or other signal processing device(s). The computer, processor(s), controller(s), or other signal processing device(s) may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor(s), controller(s), or other signal processing device(s) which is to execute the code or instructions for performing the method embodiments or operations of the apparatus embodiments herein.

The controllers, processors, control circuitry, circuits, devices, modules, units, data compressors, multiplexers, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, circuits, devices, data compressors, modules, units, multiplexers, logic, interfaces, decoders, drivers, generators and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, circuits, devices, modules, units, multiplexers, logic, interfaces, data compressors, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present teachings have been illustrated and described with respect to specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory device comprising:
   a memory group comprising a plurality of memory cells;
   a control circuitry configured to read a first hard decision data entry and a first soft decision data entry together from a first memory cell among the plurality memory cells; and
   a page buffer circuit coupled to the first memory cell via a bit line, the page buffer circuit comprising a plurality of data latches configured to store the first hard decision data entry and the first soft decision data entry and at least one cache latch configured to store one of the first hard decision data entry and the first soft decision data entry which are transferred from the plurality of data latches.

2. The memory device according to claim 1, wherein the plurality of data latches comprise:
   a first data latch configured to store the first hard decision data entry read from the first memory cell; and
   a second data latch configured to store the first soft decision data entry read from the first memory cell.

3. The memory device according to claim 2, wherein the at least one cache latch is coupled to the first data latch via a first data path and is coupled to the second data latch via a second data path.

4. The memory device according to claim 2, wherein the at least one cache latch comprises:
a first cache latch coupled to the first data latch; and
a second cache latch coupled to the second data latch.

5. The memory device according to claim 1, further comprising:
an input/output control circuit configured to receive a first read command and a first address indicating the first memory cell, and output the first hard decision data entry and the first soft decision data entry in response to the first read command;
an input/output line coupling the input/output control circuit to the page buffer circuit; and
an input/output data amplification circuit configured to amplify and transfer the first hard decision data entry and the first soft decision data entry via the input/output line.

6. The memory device according to claim 5, wherein the input/output data amplification circuit comprises a plurality of sense amplifiers corresponding to the plurality of data latches.

7. The memory device according to claim 5, wherein the at least one cache latch and the input/output data amplification circuit outputs one of three data statuses showing a combined value of the first hard decision data entry and the first soft decision data entry via a pair of input/output lines.

8. The memory device according to claim 5, further comprising:
a data compression circuit configured to compress the first soft decision data entry transferred from the input/output amplification circuit;
a register configured to store a first compressed soft decision data entry output from the data compression circuit; and
a multiplexer configured to output one of the first hard decision data entry and the first compressed soft decision data entry via the input/output line.

9. The memory device according to claim 5, wherein the input/output line is configured to transfer one selected from the first hard decision data entry and the first compressed soft decision data entry.

10. The memory device according to claim 5, wherein the input/output control circuit is configured to transfer the first soft decision data entry to an error correction circuitry after transfer the first hard decision data entry to the error correction circuitry via a channel.

11. The memory device according to claim 5, wherein the input/output control circuit is configured to alternatively transfer the first hard decision data entry and the first soft decision data entry to an error correction circuitry coupled via a channel.

12. The memory device according to claim 5,
wherein the control circuitry is configured to consecutively read the first hard decision data entry and the first soft decision data entry from the first memory cell in response to the first read command, and
wherein the input/output control circuit is configured to output the first hard decision data entry in response to the first read command, and output the first soft decision data entry after receiving a soft decision data read command associated with the first read command.

13. The memory device according to claim 12,
wherein, after the input/output control circuit receives a second read command and a second address, the control circuitry is configured to consecutively read a second hard decision data entry and a second soft decision data entry from a second memory cell corresponding to the second address in response to the second read command, and
wherein the input/output control circuit is configured to output the first hard decision data entry the first soft decision data entry in response to the first read command, while the control circuitry consecutively reads the second hard decision data entry and the second soft decision data entry.

14. The memory device according to claim 13, wherein the first memory cell and the second memory cell are coupled to the page buffer circuit via a same bit line.

15. A memory system comprising:
a controller configured to transfer a read command and an address associated with the read command to a memory device, receive data associated with the read command from the memory device, and perform an error correction based on hard decision data and soft decision data associated with the data after an error is detected in the data, wherein:
the memory device is configured to consecutively read the hard decision data and the soft decision data from a first memory cell corresponding to the address in response to the read command, and the memory device comprises:
a memory group comprising a plurality of memory cells;
a control circuitry configured to consecutively read the hard decision data and the soft decision data from the first memory cell among the plurality of memory cells; and
a page buffer circuit coupled to the first memory cell via a bit line, the page buffer circuit comprising a plurality of data latches configured to store the hard decision data and the soft decision data and at least one cache latch configured to store one of the hard decision data and the soft decision data which are transferred from the plurality of data latches.

16. The memory system according to claim 15, wherein the plurality of data latches comprise:
a first data latch configured to store the hard decision data read from the first memory cell; and
a second data latch configured to store the soft decision data read from the first memory cell.

17. The memory system according to claim 15, wherein the memory device further comprises:
an input/output control circuit configured to receive the read command and the address indicating the first memory cell, and output the hard decision data and the soft decision data to the controller in response to the read command;
an input/output line coupling the input/output control circuit to the page buffer circuit; and
an input/output data amplification circuit configured to amplify and transfer the hard decision data and the soft decision data via the input/output line.

18. A method for operating a memory system, comprising:
consecutively reading a first hard decision data entry and a first soft decision data entry from a first memory cell in response to a first read command and a first address, and storing the first hard decision data entry and the first soft decision data entry in a first data latch and a second data latch;

transferring the first hard decision data entry and the first soft decision data entry from the first data latch and the second data latch to at least one cache latch;

outputting the first hard decision data entry or the first soft decision data entry stored in the at least one cache latch via a channel coupled to a memory die; and consecutively reading a second hard decision data entry and a second soft decision data entry from a second memory cell, coupled to the first memory cell via a bit line, in response to a second read command and a second address while the first hard decision data entry and the first soft decision data entry are output from the first data latch and the second data latch via the channel.

19. The method according to claim 18, wherein the first soft decision data entry and the second soft decision data entry are individually output in response to a first soft decision data read command associated with the first read command and a second soft decision data read command associated with the second read command.

20. The method according to claim 18, wherein each of the first hard decision data entry and the second hard decision data entry comprises inverted data delivered through a pair of input/output lines, and wherein the first soft decision data entry and the second soft decision data entry is represented as one of three data statuses showing a combined value of hard decision data entry and soft decision data entry, which is delivered via the pair of input/output lines.

* * * * *